US012811276B2

(12) United States Patent
An et al.

(10) Patent No.: US 12,811,276 B2
(45) Date of Patent: Nov. 24, 2026

(54) ELECTRONIC DEVICE COMPRISING ANTENNA

(71) Applicant: Samsung Electronics Co., Ltd., Suwon-si (KR)

(72) Inventors: Chankyu An, Suwon-si (KR); Sungkoo Park, Suwon-si (KR); Himchan Yun, Suwon-si (KR); Nakchung Choi, Suwon-si (KR); Soonho Hwang, Suwon-si (KR); Jaebong Chun, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 423 days.

(21) Appl. No.: 18/322,080

(22) Filed: May 23, 2023

(65) Prior Publication Data

US 2023/0299466 A1 Sep. 21, 2023

Related U.S. Application Data

(63) Continuation of application No. PCT/KR2021/015571, filed on Nov. 1, 2021.

(30) Foreign Application Priority Data

Dec. 2, 2020 (KR) ........................ 10-2020-0166365

(51) Int. Cl.
*H01Q 1/24* (2006.01)
*H01Q 1/48* (2006.01)
(Continued)

(52) U.S. Cl.
CPC ............... *H01Q 1/243* (2013.01); *H01Q 1/48* (2013.01); *H01Q 9/0414* (2013.01); *H03H 11/28* (2013.01); *H05K 5/0226* (2013.01)

(58) Field of Classification Search
CPC ........ H01Q 1/243; H01Q 1/48; H01Q 9/0414; H03H 11/28; H05K 5/0226
(Continued)

(56) References Cited

U.S. PATENT DOCUMENTS 9,105,986 B2 8/2015 Mahanfar et al.
10,629,982 B2 4/2020 Kim et al.
(Continued)

FOREIGN PATENT DOCUMENTS

CN 1973401 A 5/2007
CN 110351404 A 10/2019
(Continued)

OTHER PUBLICATIONS

International Search Report dated Feb. 8, 2022, issued in International Application No. PCT/KR2021/015571.
(Continued)

*Primary Examiner* — Michael R Neff
(74) *Attorney, Agent, or Firm* — Jefferson IP Law, LLP

(57) ABSTRACT

A foldable electronic device comprising an antenna is provided. The foldable electronic device includes a processor, hinge module, a first housing and a second housing each having at least a portion thereof coupled to either side of the hinge module and adapted to rotate about the hinge module to form an unfolded state or a folded state, and a flexible display disposed in a space formed by the first housing and the second housing. The first housing comprises a first lateral member, the first lateral member comprising a first side surface disposed in parallel to a folding axis of the hinge module, a second side surface extending from one end of the first side surface in a direction perpendicular to the folding axis, and a third side surface extending in the direction perpendicular to the folding axis from another end of the first side surface. The second housing comprises a second lateral
(Continued)

member, the second lateral member comprising a fourth side surface disposed in parallel to the folding axis, and a fifth side surface extending in the direction perpendicular to the folding axis from one end of the fourth side surface.

10 Claims, 17 Drawing Sheets

(51) Int. Cl.
*H01Q 9/04* (2006.01)
*H03H 11/28* (2006.01)
*H05K 5/02* (2006.01)

(58) Field of Classification Search
USPC ........................................................ 455/575.3
See application file for complete search history.

(56) References Cited

U.S. PATENT DOCUMENTS

| | | | | |
|---|---|---|---|---|
| 11,432,418 | B2 | 8/2022 | Yoon et al. | |
| 2005/0243000 | A1 | 11/2005 | Hwang et al. | |
| 2010/0060664 | A1 | 3/2010 | Kilpatrick, II et al. | |
| 2017/0142241 | A1* | 5/2017 | Kim | H04M 1/026 |
| 2017/0364123 | A1 | 12/2017 | Seo et al. | |
| 2018/0026361 | A1* | 1/2018 | Sakong | H01Q 1/48 343/860 |
| 2019/0036210 | A1 | 1/2019 | Kim et al. | |
| 2019/0103656 | A1 | 4/2019 | Shi et al. | |
| 2019/0140342 | A1 | 5/2019 | Lim et al. | |
| 2019/0245954 | A1 | 8/2019 | Liu et al. | |
| 2019/0267699 | A1 | 8/2019 | Kim et al. | |
| 2020/0051468 | A1 | 2/2020 | Jung et al. | |
| 2020/0099125 | A1 | 3/2020 | Ying et al. | |
| 2020/0119429 | A1* | 4/2020 | Park | G06F 1/1616 |
| 2020/0136231 | A1 | 4/2020 | Lee et al. | |
| 2020/0266524 | A1* | 8/2020 | Yoon | H01Q 1/48 |
| 2020/0352046 | A1 | 11/2020 | Kim et al. | |
| 2020/0411957 | A1 | 12/2020 | Zhu et al. | |
| 2021/0318720 | A1* | 10/2021 | Lin | H01Q 1/243 |
| 2022/0061175 | A1 | 2/2022 | Oh et al. | |
| 2022/0320714 | A1 | 10/2022 | Li | |

FOREIGN PATENT DOCUMENTS

| | | | |
|---|---|---|---|
| CN | 111029749 | A | 4/2020 |
| CN | 111092972 | A | 5/2020 |
| CN | 111384581 | A | 7/2020 |
| EP | 3 922 002 | A1 | 12/2021 |
| EP | 3 944 055 | A1 | 1/2022 |
| KR | 10-2017-0056292 | A | 5/2017 |
| KR | 10-2017-0073964 | A | 6/2017 |
| KR | 10-2017-0120985 | A | 11/2017 |
| KR | 10-2019-0012813 | A | 2/2019 |
| KR | 10-2019-0102895 | A | 9/2019 |
| KR | 10-2019-0116498 | A1 | 10/2019 |
| KR | 10-2020-0018282 | A | 2/2020 |
| KR | 10-2020-0072190 | A | 6/2020 |
| KR | 10-2020-0101253 | A | 8/2020 |
| KR | 10-2020-0101310 | A | 8/2020 |
| KR | 10-2182633 | B1 | 11/2020 |
| RU | 2 495 475 | C2 | 10/2013 |
| RU | 2 683 290 | C2 | 3/2019 |
| WO | 2020-085714 | A1 | 4/2020 |
| WO | 2020/135150 | A1 | 7/2020 |
| WO | 2020/171597 | A1 | 8/2020 |

OTHER PUBLICATIONS

Korean Office Action dated Jan. 2, 2025, issued in Korean Patent Application No. 10-2020-0166365.
Singapore Office Action dated Sep. 24, 2024, issued in Singapore Patent Application No. 11202304213U.
Russian Office Action dated Mar. 17, 2025, issued in Russian Patent Application No. 2023114224.
Japanese Office Action dated Apr. 15, 2025, issued in Japanese Patent Application No. 2023-532230.
Extended European Search Report dated Mar. 20, 2024, issued in European Patent Application No. 21900827.3.
Japanese Office Action dated Aug. 26, 2025, issued in Japanese Patent Application No. 2023-532230.
European Office Action dated Oct. 13, 2025, issued in European Patent Application No. 21900827.3.
Vietnamese Office Action dated Nov. 7, 2025, issued in a Vietnam Patent Application No. 1-2023-03597.
Pengkuan, Design of Several Handheld Terminal Antennas available at https://liu-shen.jianguoyun.com/p/DVJ6EooQreenCxjDrp4GIAA Feb. 15, 2019.
Chinese Office Action dated Apr. 18, 2026, issued in Chinese Application No. 202180080952.7.
Malaysian Office Action dated Apr. 24, 2026, issued in Malaysian Application No. PI2023003132.
Indian Office Action dated Jun. 19, 2026, issued in Indian Application No. 202317036314.
Vietnam Office Action dated Jul. 17, 2026, issued in Vietnam Application No. 1-2023-03597.

* cited by examiner

ELECTRONIC DEVICE COMPRISING ANTENNA

CROSS-REFERENCE TO RELATED APPLICATION(S)

This application is a continuation application, claiming priority under § 365(c), of an International application No. PCT/KR2021/015571, filed on Nov. 1, 2021, which is based on and claims the benefit of a Korean patent application number 10-2020-0166365, filed on Dec. 2, 2020, in the Korean Intellectual Property Office, the disclosure of each of which is incorporated by reference herein in its entirety.

BACKGROUND

1. Field

The disclosure relates to an electronic device comprising an antenna.

2. Description of Related Art

The use of electronic devices such as smart phones, foldable phones, or tablet PCs is increasing, and various functions are provided by the electronic devices.

The electronic device may transmit to and receive from other electronic devices phone calls and various pieces of data through wireless communication.

The electronic device may include at least one antenna to perform wireless communication with other electronic devices.

The above information is presented as background information only to assist with an understanding of the disclosure. No determination has been made, and no assertion is made, as to whether any of the above might be applicable as prior art with regard to the disclosure.

SUMMARY

The portable electronic device may include a bar type, a foldable type, a rollable type, a wearable type, or a tablet personal computer (PC).

For example, in a foldable type of electronic device, a plurality of housings may be operated in a folded state or an unfolded state around a hinge module.

In the foldable electronic device, at least a portion of a plurality of housings forming an exterior may be formed of a conductive material (e.g., a metal), and at least a portion of the part formed of the conductive material may be used as an antenna radiator for wireless communication. The plurality of housings may include at least one segmentation portion (e.g., a slit).

In the foldable electronic device, radiation performance of the antenna may be degraded by a segmentation portion formed on a side surface of one housing being adjacent to a portion (e.g., a metal frame) of another housing formed of a conductive material in the case that a plurality of housings is in a folded state.

The foldable electronic device may degrade radiation performance of the antenna, in the case that a user uses fingers to hold a segmentation portion formed on a side surface of the housing in a state that the plurality of housings is in a folded or unfolded state.

In the case that the radiation performance of the antenna is degraded, the foldable electronic device may not perform properly phone calls and/or data transmission/reception with other electronic devices.

Aspects of the disclosure are to address at least the above-mentioned problems and/or disadvantages and to provide at least the advantages described below. Accordingly, an aspect of the disclosure is to provide an electronic device capable of reducing performance degradation of an antenna by using at least a portion of a first side surface on which a first segmentation portion is formed or a second side surface on which a second segmentation portion is formed as an antenna radiation area.

Additional aspects will be set forth in part in the description which follows, and in part, will be apparent from the description or may be learned by practice of the presented embodiments.

In accordance with an aspect of the disclosure, a foldable electronic device is provided. The foldable electronic device includes a processor, a hinge module, a first housing and a second housing, at least partially coupled to both sides of the hinge module, adapted to rotate about the hinge module to form an unfolded state or a folded state based on the hinge module, and a flexible display disposed in a space formed by the first housing and the second housing, wherein the first housing includes a first lateral member forming at least a portion of an exterior of the foldable electronic device, and the first lateral member includes a first side surface disposed parallel to a folding axis of the hinge module, a second side surface extending in a direction perpendicular to the folding axis from one end of the first side surface, and a third side surface extending in a direction perpendicular to the folding axis from another end of the first side surface, the second housing includes a second lateral member forming at least a portion of the exterior of the foldable electronic device, and the second lateral member includes a fourth side surface disposed parallel to the folding axis, a fifth side surface extending in a direction perpendicular to the folding axis from one end of the fourth side surface, and a sixth side surface extending in a direction perpendicular to the folding axis from another end of the fourth side surface, wherein a first segmentation portion is formed on the first side surface, a second segmentation portion is formed on the second side surface, and a third segmentation portion is formed on the fifth side surface, wherein, in the case that the first housing and the second housing are in a folded state, the second segmentation portion and the third segmentation portion are disposed to overlap each other, and a portion of the first side surface separated through the first segmentation portion and a portion of the second side surface separated through the second segmentation portion are electrically connected to the processor and operate as an antenna, wherein the antenna includes a power supply unit connected to a power supply point disposed on the second side surface, a first matching circuit connected to a first point located between the power supply point and the first segmentation portion, and a second matching circuit connected to a second point disposed between the power supply point and the second segmentation portion.

In accordance with another aspect of the disclosure, a multi-foldable electronic device is provided. The multi-foldable electronic device includes a processor, a hinge module, a folding part, a first housing and a second housing, at least partially coupled to both sides of the hinge module, that form an unfolded state or a folded state through in-folding about a first folding axis of the hinge module, and a third housing disposed in an opposite direction to the second housing based on a second folding axis of the folding part and forming an unfolded state or a folded state through out-folding about the second folding axis, and a flexible display disposed in a space formed by the first housing, the second housing, and the third housing, wherein the first housing includes a first lateral member forming at least a portion of an exterior of the multi-foldable electronic device, and the first lateral member includes a first side surface disposed parallel to the first folding axis of the hinge module, a second side surface extending in a direction perpendicular to the first folding axis from one end of the first side surface, and a third side surface extending in the direction perpendicular to the first folding axis from another end of the first side surface, the second housing includes a second lateral member forming at least a portion of the exterior of the multi-foldable electronic device, and the second lateral member includes a fourth side surface disposed substantially parallel to the second side surface of the first housing and a fifth side surface disposed substantially parallel to the third side surface of the first housing, and the third housing includes a third lateral member forming at least a portion of the exterior of the multi-foldable electronic device, and the third lateral member includes a sixth side surface disposed parallel to the second folding axis of the folding part, a seventh side surface extending from one end of the sixth side surface toward the fourth side surface of the second housing in a direction perpendicular to the second folding axis, and an eighth side surface extending from another end of the sixth side surface toward the fifth side surface of the second housing in the direction perpendicular to the second folding axis, wherein a first segmentation portion is formed on the first side surface, a second segmentation portion is formed on the second side surface, a third segmentation portion is formed on the fourth side surface, and a fourth segmentation portion is formed on the seventh side surface, wherein, in the case that the first housing, the second housing, and the third housing are in a folded state, the second segmentation portion, the third segmentation portion, and the fourth segmentation portion are disposed to overlap one another, and a portion of the first side surface separated through the first segmentation portion and a portion of the second side surface separated through the second segmentation portion are electrically connected to the processor and operate as an antenna, wherein the antenna includes a power supply unit connected to a power supply point located on the second side surface, a first matching circuit connected to a first point located between the power supply point and the first segmentation portion, and a second matching circuit connected to a second point located between the power supply point and the second segmentation portion.

According to various embodiments of the disclosure, the performance degradation of the antenna may be reduced by selecting and using at least a portion of the first side surface, on which the first segmentation portion is formed, or the second side surface, on which the second segmentation portion is formed, as an antenna radiation area through adjustment of a matching value of a switch.

In addition to this, various effects identified directly or indirectly through this document may be provided.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding, but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but are merely used by the inventor to enable a clear and consistent understanding of the disclosure. Accordingly, it should be apparent to those skilled in the art that the following description of various embodiments of the disclosure is provided for illustration purposes only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
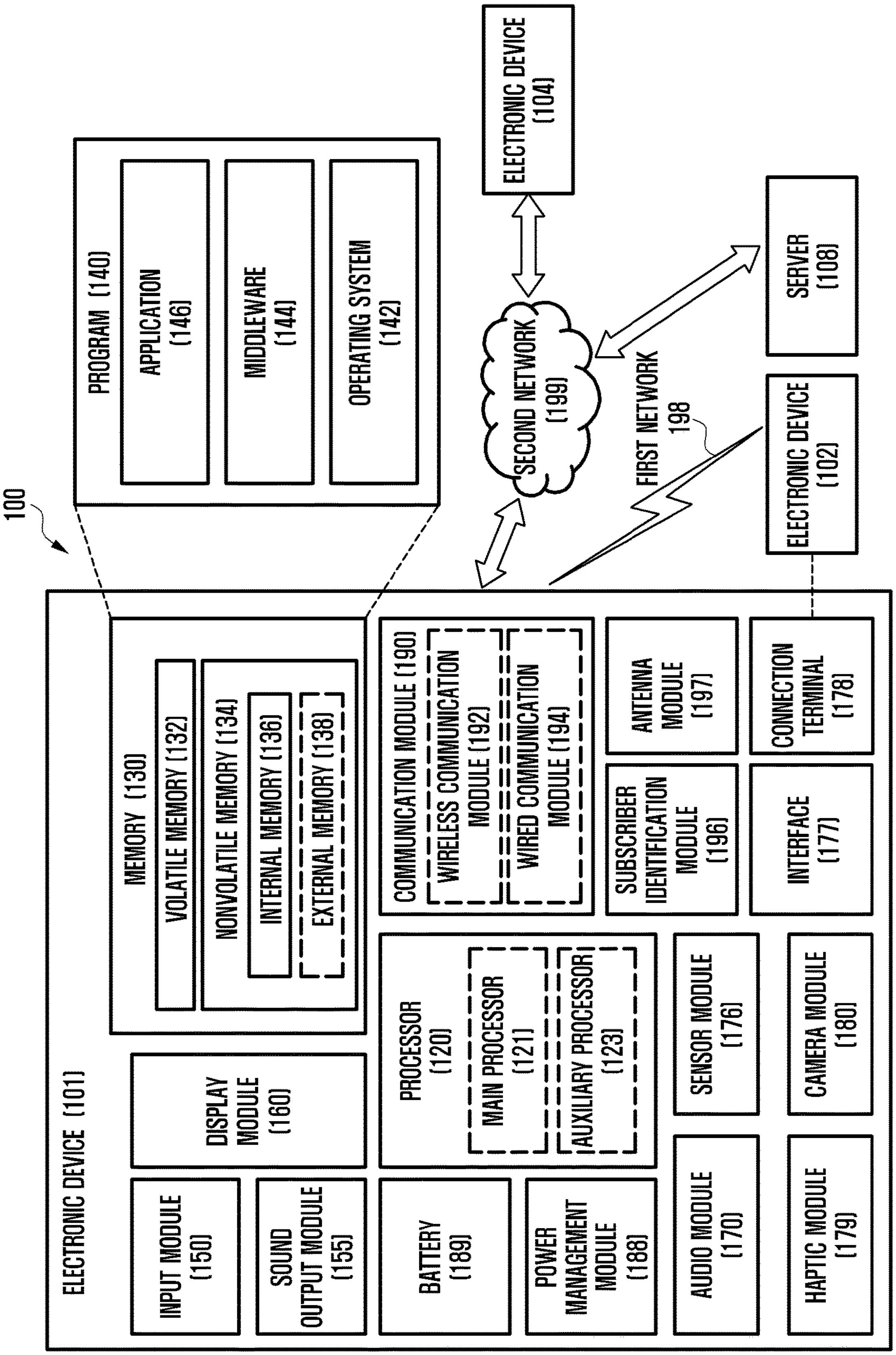
FIG. 1 is a block diagram of an electronic device in a network environment according to an embodiment of the disclosure.

FIG. 1 is a block diagram illustrating an electronic device 101 in a network environment 100 according to an embodiment of the disclosure.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, For example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 may include the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, For example, software (e.g., the program 140) and input data or output data for a command related thereto. The memory 130 may include the volatile memory 132 or the non-volatile memory 134.

The program 140 may be stored in the memory 130 as software, and may include, For example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, For example, a microphone, a mouse, a keyboard, a key (e.g., a button), or a digital pen (e.g., a stylus pen).

The sound output module 155 may output sound signals to the outside of the electronic device 101. The sound output module 155 may include, For example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, For example, a display, a hologram device, or a projector and control circuitry to control a corresponding one of the display, hologram device, and projector. According to an embodiment, the display module 160 may include a touch sensor adapted to detect a touch, or a pressure sensor adapted to measure the strength of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, For example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, For example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, For example, a HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, For example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, For example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a fifth generation (5G) network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a fourth generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the millimeter wave (mmWave) band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 gigabits per second (Gbps) or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, For example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a lateral) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic device 102 or 104 may be a device of a same type as, or a different type, from the electronic device 101. According to an embodiment, all or some of operations to be executed at the electronic device 101 may be executed at one or more of the external electronic device 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The electronic device 101 may provide the outcome, with or without further processing of the outcome, as at least part of a reply to the request. To that end, a cloud computing, distributed computing, mobile edge computing (MEC), or client-server computing technology may be used, For example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) on the basis of 5G communication technology or IoT-related technology.

The electronic device according to various embodiments may be one of various types of electronic devices. The electronic devices may include, for example, a portable communication device (e.g., smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. As used herein, each of such phrases as "A or B", "at least one of A and B", "at least one of A or B", "A, B, or C", "at least one of A, B, and C", and "at least one of A, B, or C" may include any one of, or all possible combinations of the items enumerated together in a corresponding one of the phrases. As used herein, such terms as "$1^{st}$" and "$2^{nd}$", or "first" and "second" may be used to simply distinguish a corresponding component from another, and does not limit the components in other aspect (e.g., importance or order). It is to be understood that if an element (e.g., the first element) is referred to, with or without the term "operatively" or "communicatively", as "coupled with", "coupled to", "connected with", or "connected to" another element (e.g., the second element), it means that the element may be coupled with the other element directly (e.g., wiredly), wirelessly, or via the third element.

As used in connection with various embodiments of the disclosure, the term "module" may include a unit implemented in hardware, software, or firmware, and may interchangeably be used with other terms, For example, "logic", logic block", "part", or "circuitry". A module may be a single integral component, or a minimum unit or part thereof, adapted to perform one or more functions. For example, according to an embodiment, the module may be implemented in a form of an application-specific integrated circuit (ASIC).

Figure 2A:
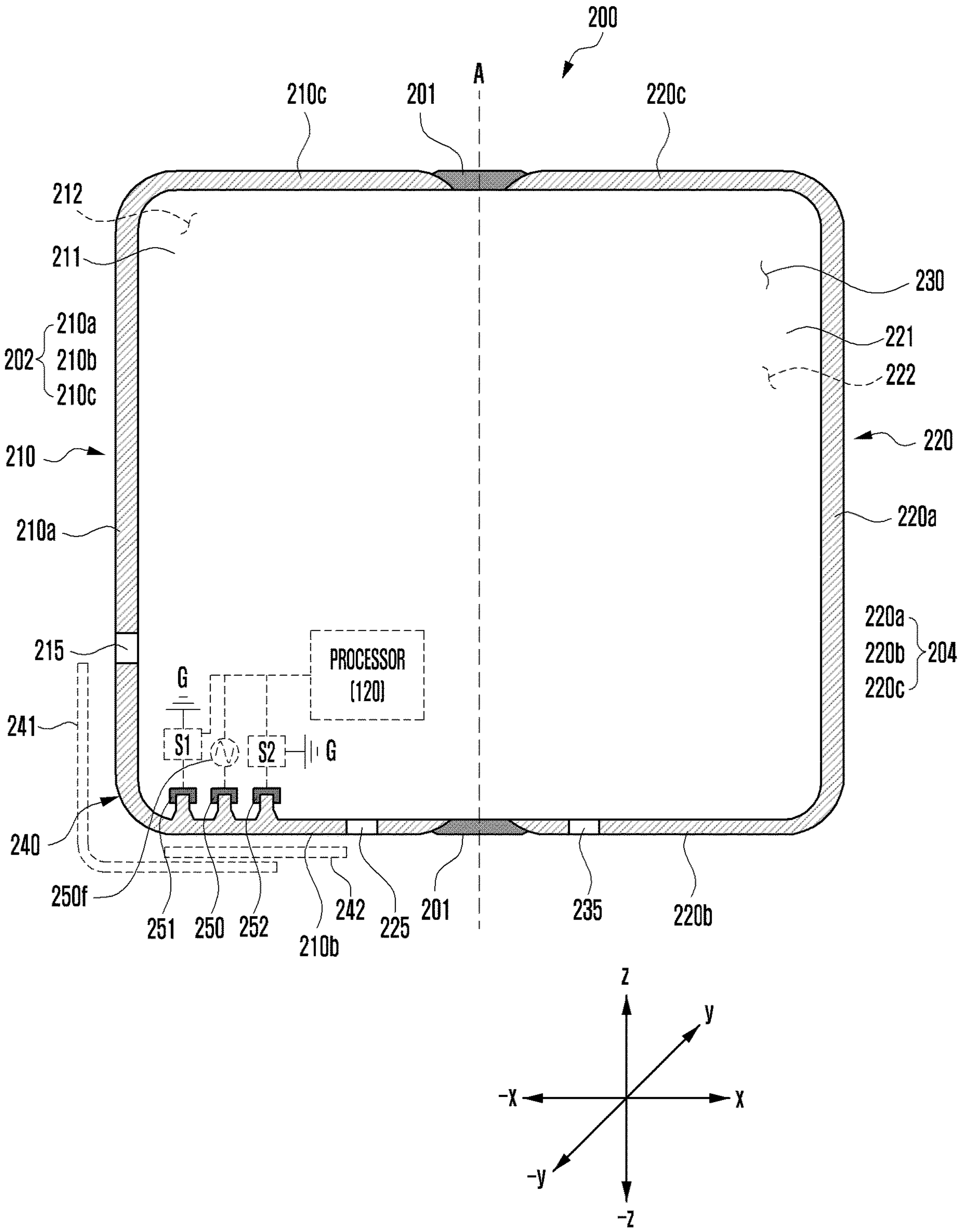
FIG. 2A is a diagram schematically illustrating an embodiment of an unfolded state of a foldable electronic device according to an embodiment of the disclosure.
Figure 2B:
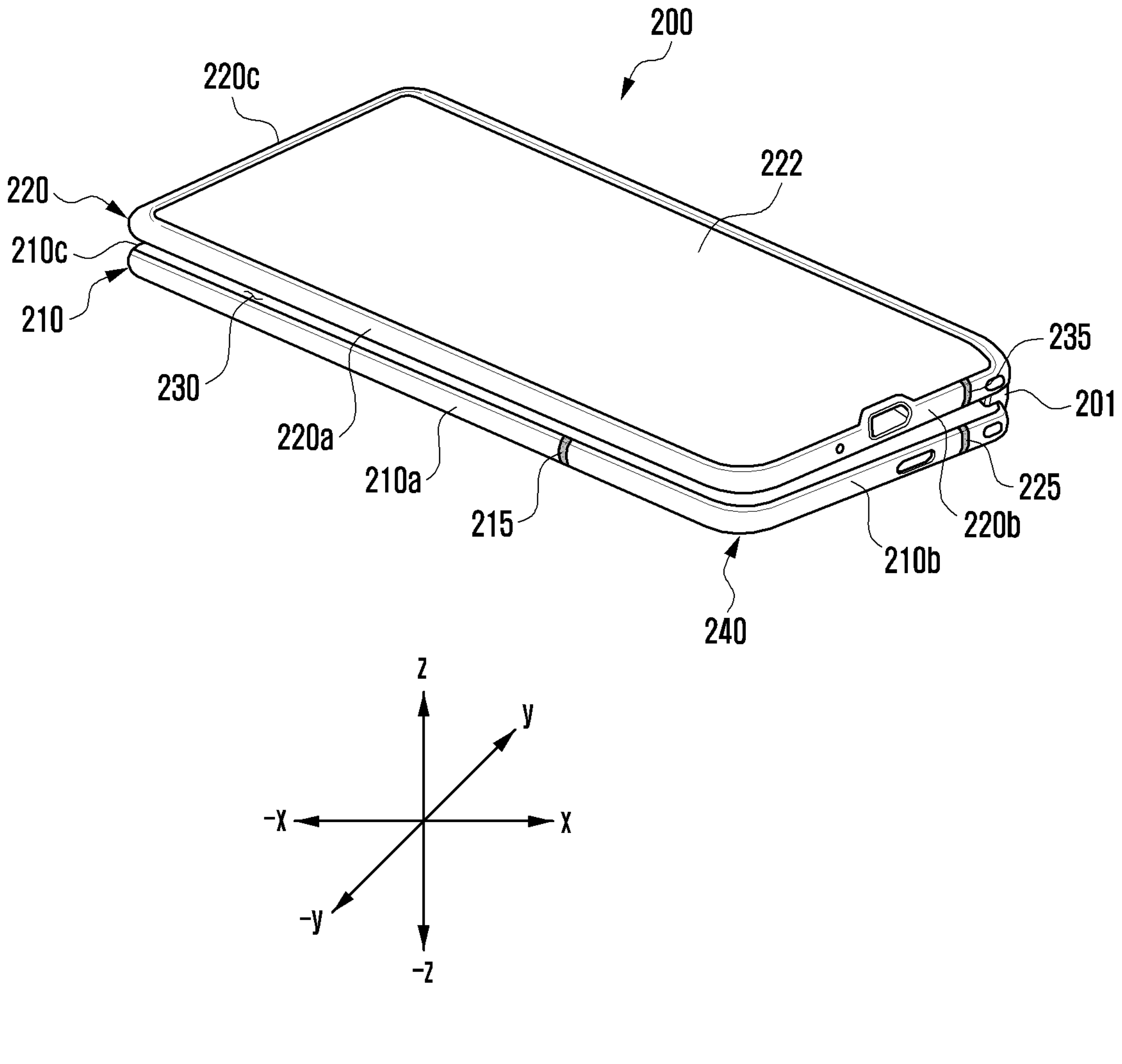
FIG. 2B is a diagram schematically illustrating an embodiment of a folded state of a foldable electronic device according to an embodiment of the disclosure.

FIG. 2A is a diagram schematically illustrating an embodiment of an unfolded state of a foldable electronic device according to an embodiment of the disclosure. FIG. 2B is a diagram schematically illustrating an embodiment of a folded state of a foldable electronic device according to an embodiment of the disclosure.

The foldable electronic device 200 disclosed in FIGS. 2A and 2B may include, for example, a foldable phone that is unfolded or folded in a horizontal or vertical direction. The foldable electronic device 200 of FIGS. 2A and 2B may include the electronic device 101 shown in FIG. 1. The foldable electronic device 200 may include at least one of components included in the electronic device 101 illustrated in FIG. 1.

Referring to FIGS. 2A and 2B, the foldable electronic device 200 according to various embodiments of the disclosure may include a first housing 210 and a second housing 220 forming an unfolded state or a folded state based on a hinge module 201.

According to an embodiment, the hinge module 201 may rotatably couple the first housing 210 and the second housing 220 around the folding axis A.

According to various embodiments, when the foldable electronic device 200 is in an unfolded state (e.g., FIG. 2A), the first housing 210 and the second housing 220 may be disposed at an angle of 180° to be substantially flat. When the foldable electronic device 200 is in a folded state (e.g., FIG. 2B), the first housing 210 and the second housing 220 may be disposed to face each other.

According to an embodiment, the foldable electronic device 200 may include a flexible display 230 (e.g., a foldable display) disposed in a space formed by the first housing 210 and the second housing 220. For example, the flexible display 230 disposed in the space formed by the first housing 210 and the second housing 220 may include one display or at least two displays.

According to various embodiments, the first housing 210, in an unfolded state, may have a first surface 211 facing a first direction (e.g., a front direction, a z-axis direction) and a second surface 212 facing a second direction (e.g., a rear direction, a −z axis direction) that is a direction opposite to the first surface 211. According to an embodiment, the second housing 220, in an unfolded state, may have a third surface 221 facing a first direction (e.g., a front direction, a z-axis direction) and a fourth surface 222 facing a second direction (e.g., a rear direction, a −z direction) that is a direction opposite to the third surface 221.

According to an embodiment, the foldable electronic device 200 may operate in a method that, in an unfolded state, the first surface 211 of the first housing 210 and the third surface 221 of the second housing 220 face a first direction (e.g., a z-axis direction) that is substantially the same and, in a folded state, the first surface 211 of the first housing 210 and the third surface 221 of the second housing 220 face each other. According to an embodiment, the foldable electronic device 200 may operate in a method that, in an unfolded state, the second surface 212 of the first housing 210 and the fourth surface 222 of the second housing 220 face a second direction (e.g., a rear direction, a −z-axis direction) that is substantially the same and, in a folded state, the second surface 212 of the first housing 210 and the fourth surface 222 of the second housing 220 face in opposite directions. For example, when the foldable electronic device 200 is in a folded state, the second surface 212 of the first housing 210 may face a second direction (e.g., a rear direction or a −z-axis direction) and the fourth surface 222 of the housing 220 may face a first direction (e.g., a front direction, a z-axis direction).

According to various embodiments, the first housing 210 and the second housing 220 may be disposed on both sides of the folding axis A and have substantially symmetrical shapes with respect to the folding axis A. The angle or distance between the first housing 210 and the second housing 220 may vary depending on whether the foldable electronic device 200 is in an unfolded state, a folded state, or an intermediate state.

According to various embodiments, the first housing 210 and the second housing 220 may have an asymmetrical shape with respect to the folding axis A. For example, when the foldable electronic device 200 is in a folded state, the first housing 210 and the second housing 220 may be folded in an asymmetrical form around the folding A so that a portion of the flexible display 230 is exposed to the outside of the foldable electronic device 200.

According to an embodiment, the first housing 210 may include a first lateral member 202 forming at least partially the exterior of the foldable electronic device 200 and a first rear surface cover (not shown) connected to the first lateral member 202 and forming at least a portion of the second surface 212 of the electronic device 200. For example, the first lateral member 202 may include a first side surface 210*a* disposed parallel to the folding axis A, a second side surface 210*b* extending in a direction substantially perpendicular to the folding axis A from one end of the first side surface 210*a*, and a third side surface 210*c* extending in a direction substantially perpendicular to the folding axis A from the other end of the first side surface 210*a*.

According to an embodiment, the second housing 220 may include a second lateral member 204 forming at least partially the exterior of the foldable electronic device 200 and a second rear surface cover (not shown) coupled with the second lateral member 204 and forming at least a portion of the fourth surface 222 of the electronic device 200. For example, the second lateral member 204 may include a fourth side surface 220*a* disposed substantially parallel to the folding axis A, a fifth side surface 220*b* extending in a direction substantially perpendicular to the folding axis A from one end of the fourth side surface 220*a*, and a sixth side surface 220*c* extending in a direction substantially perpendicular to the folding axis A from the other end of the fourth side surface 220*a*.

According to an embodiment, the first side surface 210*a* of the first lateral member 202 may include a first segmentation portion 215. For example, the first segmentation portion 215 may separate a portion of the first side surface 210*a*. The second side surface 210*b* of the first lateral member 202 may include a second segmentation portion 225. For example, the second segmentation portion 225 may separate a portion of the second side surface 210*b*. The fifth side surface 220*b* of the second lateral member 204 may include a third segmentation portion 235. For example, the third segmentation portion 235 may separate a portion of the fifth side surface 220*b*. For example, the first segmentation portion 215, the second segmentation portion 225, and/or the third segmentation portion 235 may be formed in the form of a slit.

According to various embodiments, a non-conductive material may be filled in the first segmentation portion 215, the second segmentation portion 225, and/or the third segmentation portion 235. The non-conductive material may prevent intrusion of foreign substances from the outside to the inside of the foldable electronic device 200. The non-conductive material may include, for example, a dielectric (e.g., an insulator) including at least one of polycarbonate, polyimide, plastic, polymer, or ceramic.

According to an embodiment, the second segmentation portion 225 formed on the second side surface 210*b* and the third segmentation portion 235 formed on the fifth side surface 220*b* may be formed on a first side (e.g., a left side) and a second side (e.g., a right side) based on the hinge module 201. In the case that the foldable electronic device 200 is in a folded state (e.g., FIG. 2B), when viewed from the top of the second rear surface cover (not shown), the second segmentation portion 225 and the third segmentation portion 235 may be disposed to overlap each other. The second segmentation portion 225 and the third segmentation portion 235 disposed to overlap each other may reduce degradation of radiation performance of the antenna 240.

According to an embodiment, a portion of the first side surface 210*a* separated through the first segmentation portion 215 and a portion of the second side surface 210*b* separated through the second segmentation portion 225 may operate as an antenna radiator and form an antenna 240 by being electrically connected to the processor 120 (e.g., the processor 120 of FIG. 1) or the communication module (e.g., the communication module 190 of FIG. 1) in the foldable electronic device 200. For example, a portion of the first side surface 210*a* and a portion of the second side surface 210*b* may be a conductive portion (e.g., an antenna 240 radiator) extending from the first segmentation portion 215 to the second segmentation portion 225. At least a portion of the conductive portion may operate as a radiator of the antenna 240.

For example, the antenna 240 may operate in frequency bands of low band (e.g., about 600 megahertz (MHz) to 1200 MHz), mid band (e.g., about 1500 MHz to 2200 MHz), and high band (e.g., about 2300 MHz to 2700 MHz). The frequency band of the antenna 240 is not limited to the above example, and signals of other frequency bands may be transmitted and received.

According to an embodiment, the antenna 240 may include a power supply unit 250*f* connected to the power supply point 250 located on the second side surface 210*b*, a first matching circuit S1 connected to the first point 251 located between the power supply point 250 and the first segmentation portion 215, and a second matching circuit S2 connected to the second point 252 located between the power supply point 250 and the second segmentation portion 225.

Figure 13:
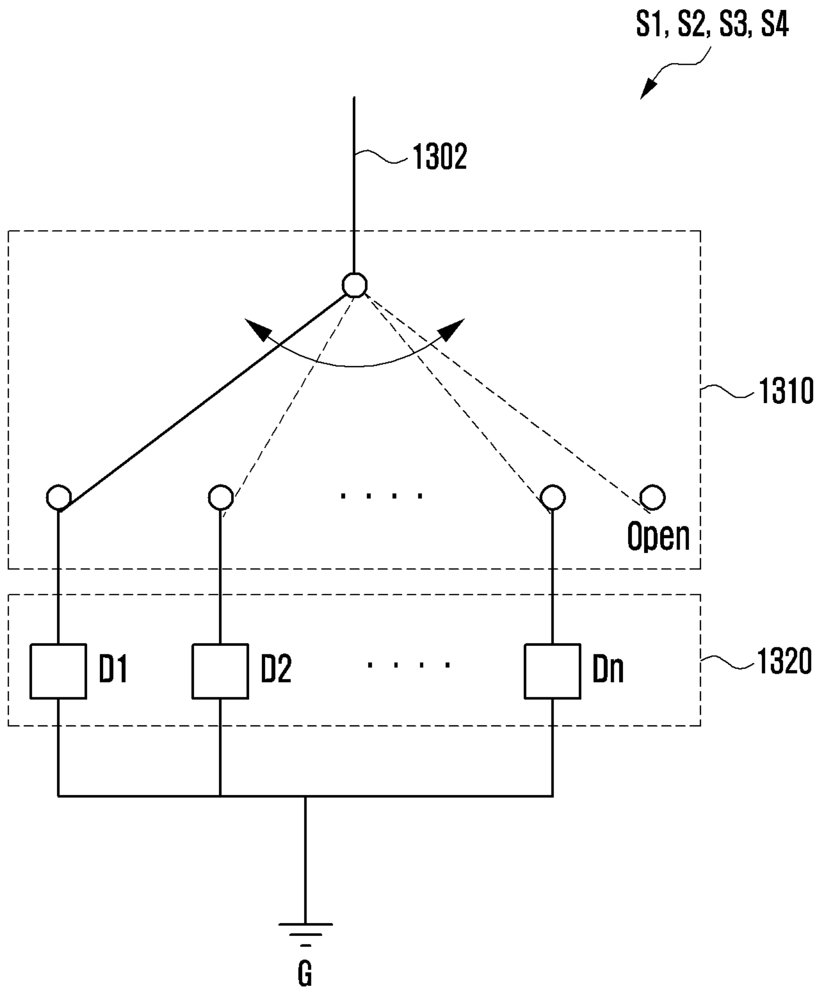
FIG. 13 is a diagram illustrating the configuration of a matching circuit according to an embodiment of the disclosure.

For example, the first matching circuit S1 may include a first switch (e.g., the switch 1310 of FIG. 13) and/or at least one lumped element (e.g., the passive elements 1320 of FIG. 13). The second matching circuit S2 may include a second switch (e.g., the switch 1310 of FIG. 13) and/or at least one lumped element (e.g., the passive elements 1320 of FIG. 13). At least one lumped element may include a capacitor or an inductor. The power supply unit 250*f* may be disposed between the first matching circuit S1 and the second matching circuit S2.

According to various embodiments, the power supply unit 250*f* may be connected to the power supply point 250 located on the second side surface 210*b*. The power supply unit 250*f* may be electrically connected to the processor 120 (or the communication module 190). The power supply unit 250*f* may support the antenna 240 to transmit and receive radio signals. The power supply unit 250*f* may be connected to the power supply point 250 through, for example, a C-clip. The power supply unit 250*f* may supply power to the antenna 240.

According to various embodiments, the first matching circuit S1 and the second matching circuit S2 may adjust the electrical length of the antenna 240 using a first switch, a second switch, or at least one lumped element.

According to various embodiments, the first matching circuit S1 may be connected to a first point 251 closer to the first side surface 210*a* than the power supply point 250. For example, the first point 251 may be disposed on one side (e.g., the left side, in the −x-axis direction) of the power supply unit 250*f*. In an embodiment, the first point 251 may be disposed adjacent to the first segmentation portion 215 formed on the first side surface 210*a*. The first matching circuit S1 may be electrically connected to the processor 120 or the communication module 190. In an embodiment, the first point 251 may be disposed at a distance of about λ/4 or more from the first segmentation portion 215 based on the low band. In an embodiment, the first matching circuit S1 may selectively connect a conductive portion (e.g., the antenna 240) electrically to the ground G. In an embodiment, the first switch of the first matching circuit S1 may be used as a shunt element of the tuner. According to an embodiment, the first matching circuit S1 may adjust a matching value under the control of the processor 120 or the communication module 190.

According to various embodiments, the processor 120 (or the communication module 190) may adjust an electrical path of the antenna 240 by controlling the first switch included in the first matching circuit S1 to be turned on and the second switch included in the second matching circuit S2 to be in an insulation mode (e.g., an open state). For example, in the case that the first switch included in the first matching circuit S1 is turned on and the conductive part (e.g., the antenna 240) is connected to the ground G at the first point 251, the antenna 240 may use the second area 242, which is a conductive portion between the first point 251 and the second segmentation portion 225, as a main radiation area. For example, a portion of the second side surface 210*b* adjacent to the second segmentation portion 225 may be the main radiation area.

According to various embodiments, the second matching circuit S2 may be connected to a second point 252 farther from the first side surface 210*a* than the power supply point 250. For example, the second point 252 may be disposed on the other side (e.g., the right side) of the power supply unit 250*f*. In an embodiment, the second point 252 may be disposed adjacent to the second segmentation portion 225 formed on the second side surface 210*b*. The second matching circuit S2 may be electrically connected to the processor 120 (or the communication module 190). In an embodiment, the second point 252 may be disposed at a distance greater than about λ/4 from the second segmentation portion 225 based on the low band. The second matching circuit S2 may selectively connect a conductive part (e.g., a part of the antenna 240) electrically to the ground G by using a second switch included in the second matching circuit S2. In an embodiment, the second switch may be used as a shunt element of a tuner. The matching value of the second matching circuit S2 may be adjusted according to the control of the processor 120 (or the communication module 190).

According to various embodiments, the processor 120 or the communication module 190 may adjust an electrical path of the antenna 240 by controlling the second switch included in the second matching circuit S2 to be turned on and the first switch included in the first matching circuit S1 to be in an insulation mode (e.g., an open state). For example, in the case that the second switch included in the second matching circuit S2 is turned on and the conductive part (e.g., the antenna 240) is connected to the ground G at the second point 252, the antenna 240 may use the first area 241, which is a conductive portion between the second point 252 and the first segmentation portion 215, as a main radiation area. For example, portions of the first side surface 210*a* and the second side surface 210*b* adjacent to the first segmentation portion 215 may be the main radiation area.

According to various embodiments, the first matching circuit S1 may include a first switch, a first lumped element, or a second lumped element. The second matching circuit S2 may include a second switch, a third lumped element, or a fourth lumped element. For example, the first lumped element and the third lumped element may have a higher L value than the second lumped element and the fourth lumped element. The first matching circuit S1 may electrically connect the first point 251 of the conductive part (e.g., the antenna 240) to the ground G. The second matching circuit S2 may be electrically connected to the ground G at the second point 252 of the conductive part (e.g., the antenna 240).

In an embodiment, the processor 120 (or the communication module 190) may control the portion (e.g., the first area 241) of the antenna 240 adjacent to the first segmentation portion 215 to be a main radiation area by connecting the first switch included in the first matching circuit S1 to the first lumped element to electrically connect it to the ground G and by connecting the second switch included in the second matching circuit S2 to the fourth lumped element to electrically connect it to the ground G. As another example, the processor 120 (or the communication module 190) may control the portion (e.g., the second area 242) of the antenna 240 adjacent to the second segmentation portion 225 to be a main radiation area by connecting the first switch included in the first matching circuit S1 to the second lumped element to electrically connect it to the ground G and by connecting the second switch included in the second matching circuit S2 to the third lumped element to electrically connect it to the ground G.

According to various embodiments, the first matching circuit S1 and the second matching circuit S2 may convert the frequency range of the antenna 240 by the matching value being adjusted through the processor 120 (or the communication module 190).

According to an embodiment, the antenna 240 may use the first area 241, which is a conductive portion between the first segmentation portion 215 and the second point 252, as a main radiation area, or it may use the second area 242, which is a conductive portion between the first point 251 and the second segmentation portion 225, as a main radiation area, as the matching values of the first matching circuit S1 and the second matching circuit S2 are adjusted.

For example, when the foldable electronic device 200 is in a folded state (e.g., FIG. 2B), radiation performance of the antenna 240 may be degraded if the first segmentation portion 215 formed on the first side surface 210*a* of the first housing 210 is adjacent to or overlaps with the fourth side surface 220*a* of the second housing formed of a conductive material. In this case, the processor 120 (or the communication module 190) may transmit and receive a wireless signal using the second area 242, which is a conductive portion between the first point 251 and the second segmentation portion 225, as a main radiation area by turning on the first matching circuit S1 and adjusting the electrical path of the antenna 240.

According to various embodiments, when the foldable electronic device 200 is in an unfolded state (e.g., FIG. 2A) or a folded state (e.g., FIG. 2B), the radiation performance of the antenna 240 may be degraded if the first segmentation portion 215 formed on the first side surface 210*a* of the first housing 210 is gripped by a user's fingers. In this case, the processor 120 (or the communication module 190) may transmit and receive a wireless signal using the second area 242, which is a conductive portion between the first point 251 and the second segmentation portion 225, as a main radiation area by turning on the first matching circuit S1 and adjusting the electrical path of the antenna 240.

According to various embodiments, the foldable electronic device 200 may include a recess (not shown) formed to accommodate the flexible display 230 through the structural coupling of a first housing 210 (e.g., the first lateral member 202) and a second housing 220 (e.g., the second lateral member 204). The foldable electronic device 200 may include a printed circuit board (not shown) inside the first housing 210 and/or the second housing 220. A processor 120, a memory 130, an input module 150, an audio output module 155, an audio module 170, a sensor module 176, a haptic module 179, a camera module 180, and/or a communication module 190 may be disposed in the printed circuit board. According to an embodiment, at least a portion of the first housing 210 and the second housing 220 may be formed of a metal material or a non-metal material to support the flexible display 230.

According to various embodiments, the foldable electronic device 200 may be an in-folding type electronic device that is folded in an inward direction to face itself so that a flexible display 230 may not be substantially exposed to the outside of the foldable electronic device 200 in a folded state (e.g., FIG. 2B). In another embodiment (not shown), in a folded state, the flexible display 230 may also be an out-folding type electronic device that is folded in an outward direction so that the flexible display 230 may be visually exposed to the outside of the foldable electronic device 200. In another embodiment (not shown), the foldable electronic device 200 may be a multi-folding type foldable electronic device in which an in-folding method and an out-folding method are combined.

Figure 3A:
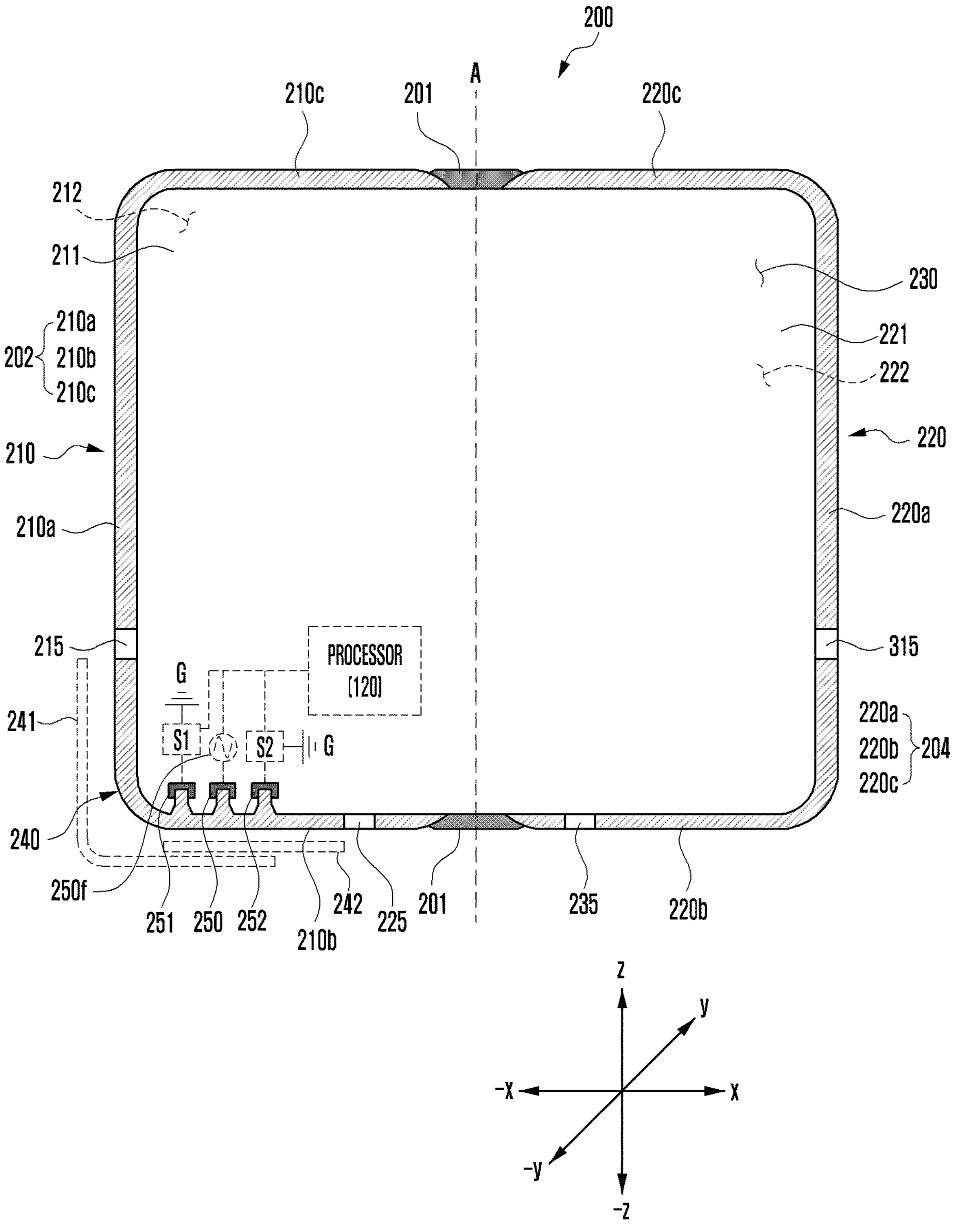
FIG. 3A is a diagram schematically illustrating another embodiment of an unfolded state of a foldable electronic device according to an embodiment of the disclosure.
Figure 3B:
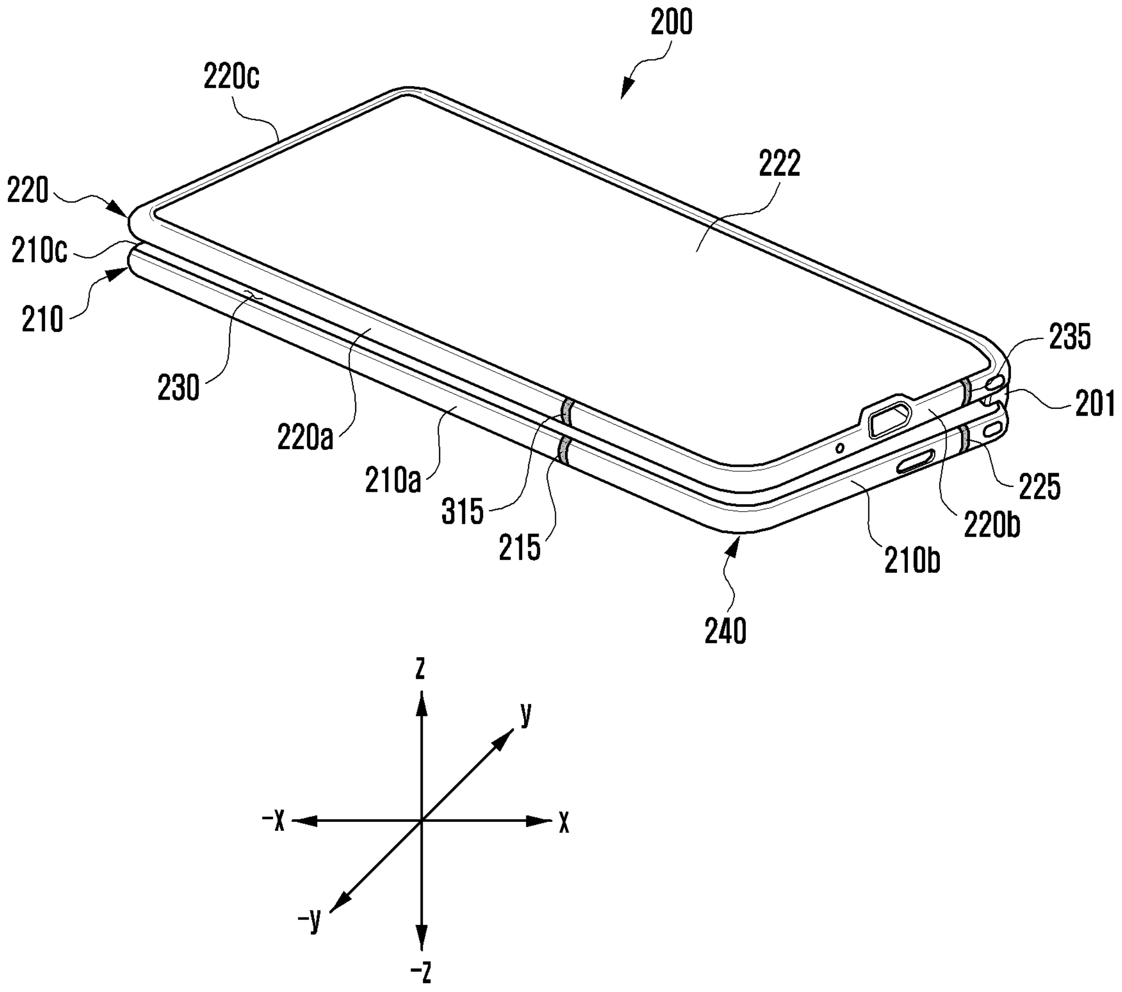
FIG. 3B is a diagram schematically illustrating another embodiment of a folded state of a foldable electronic device according to an embodiment of the disclosure.

FIG. 3A is a diagram schematically illustrating another embodiment of an unfolded state of a foldable electronic device according to an embodiment of the disclosure. FIG. 3B is a diagram schematically illustrating another embodiment of a folded state of a foldable electronic device according to an embodiment of the disclosure.

In the description of FIGS. 3A and 3B, the same reference numerals are assigned to components identical to those of FIGS. 2A and 2B described above, and redundant descriptions of functions and arrangements thereof may be omitted. The foldable electronic device 200 of FIGS. 3A and 3B may include the electronic device 101 of FIG. 1 and the foldable electronic device 200 of FIGS. 2A and 2B.

Hereinafter, in the description of FIGS. 3A and 3B, different parts from the embodiment of FIGS. 2A and 2B described above will be described.

Referring to FIGS. 3A and 3B, the foldable electronic device 200 according to various embodiments of the disclosure may include a fourth segmentation portion 315 on a fourth side surface 220*a* of the second housing 220. The fourth segmentation portion 315 may separate a portion of the fourth side surface 220*a*. The fourth segmentation portion 315 may be formed in the form of a slit. A non-conductive material (e.g., insulator) may be filled in the fourth segmentation portion 315.

According to an embodiment, the fourth segmentation portion 315 may be formed at a position corresponding to the first segmentation portion 215 formed on the first side surface 210*a* of the first housing 210 with respect to the folding axis A.

According to an embodiment, in the case that the foldable electronic device 200 is in a folded state (e.g., FIG. 3B), when viewed from the top of the second rear surface cover (not shown), the first segmentation portion 215 and the fourth segmentation portion 315 may be disposed to overlap each other. The second segmentation portion 225 and the third segmentation portion 235 disposed to overlap each other may reduce degradation of radiation performance of the antenna 240.

Figure 4:
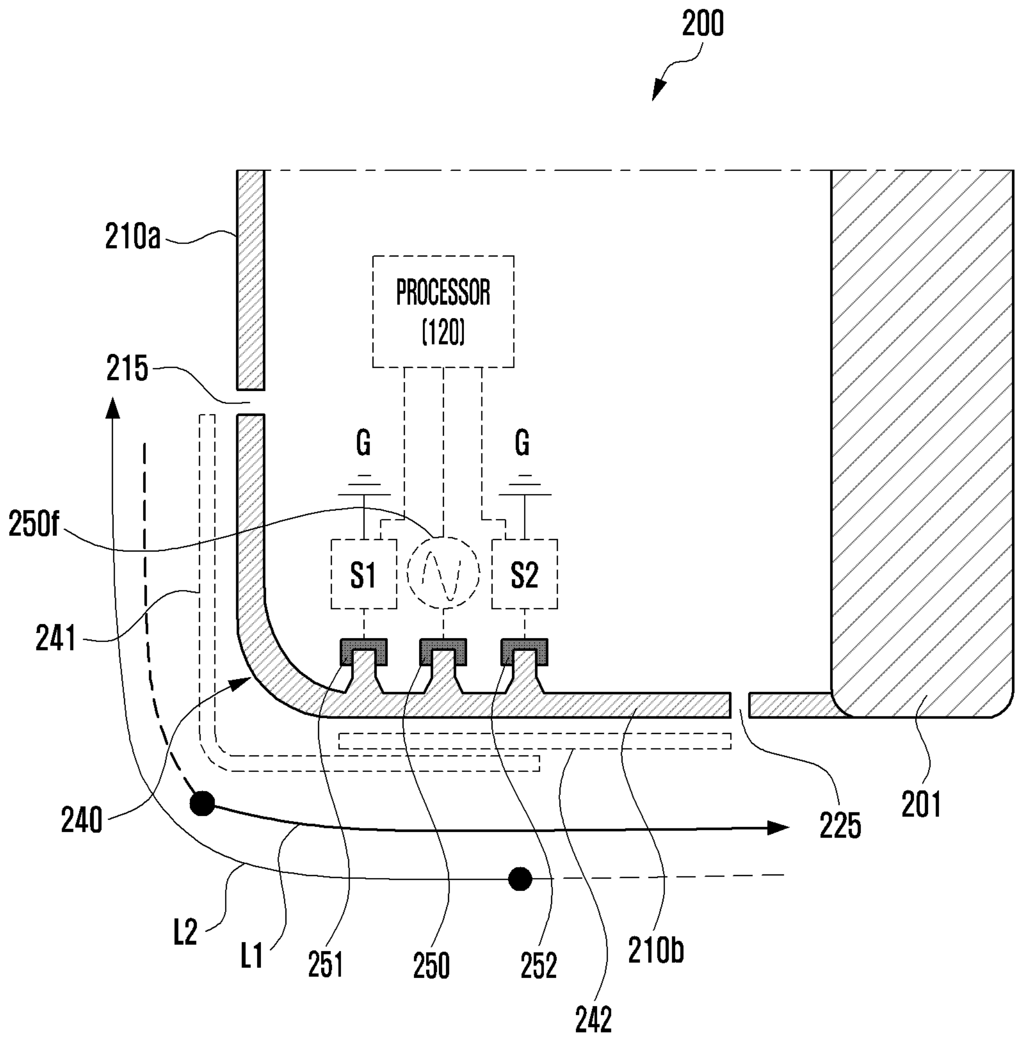
FIG. 4 is a diagram illustrating an operation of an antenna of a foldable electronic device according to an embodiment of the disclosure.

FIG. 4 is a diagram illustrating an operation of an antenna of a foldable electronic device according to an embodiment of the disclosure.

Figure 5:
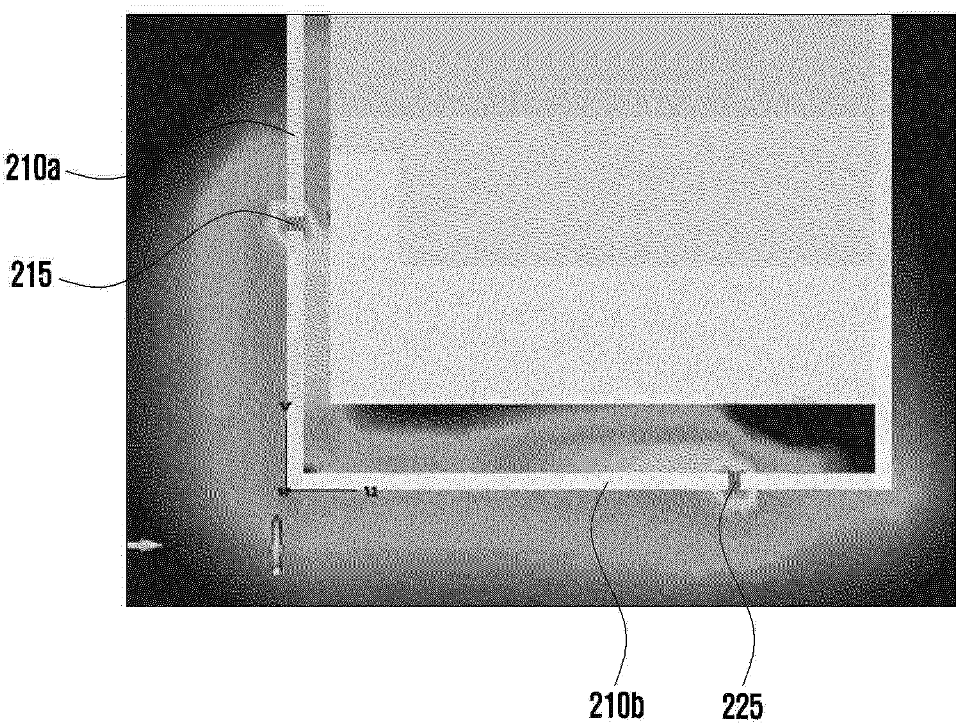
FIG. 5 is a diagram illustrating the electric field when an antenna of a foldable electronic device performs radiation through a first area between a first segmentation portion and a second point and a second area between a first point and a second segmentation portion according to an embodiment of the disclosure.

FIG. 5 is a diagram illustrating the electric field when an antenna of a foldable electronic device performs radiation through a first area between a first segmentation portion and a second point and a second area between a first point and a second segmentation portion according to an embodiment of the disclosure.

Figure 6:
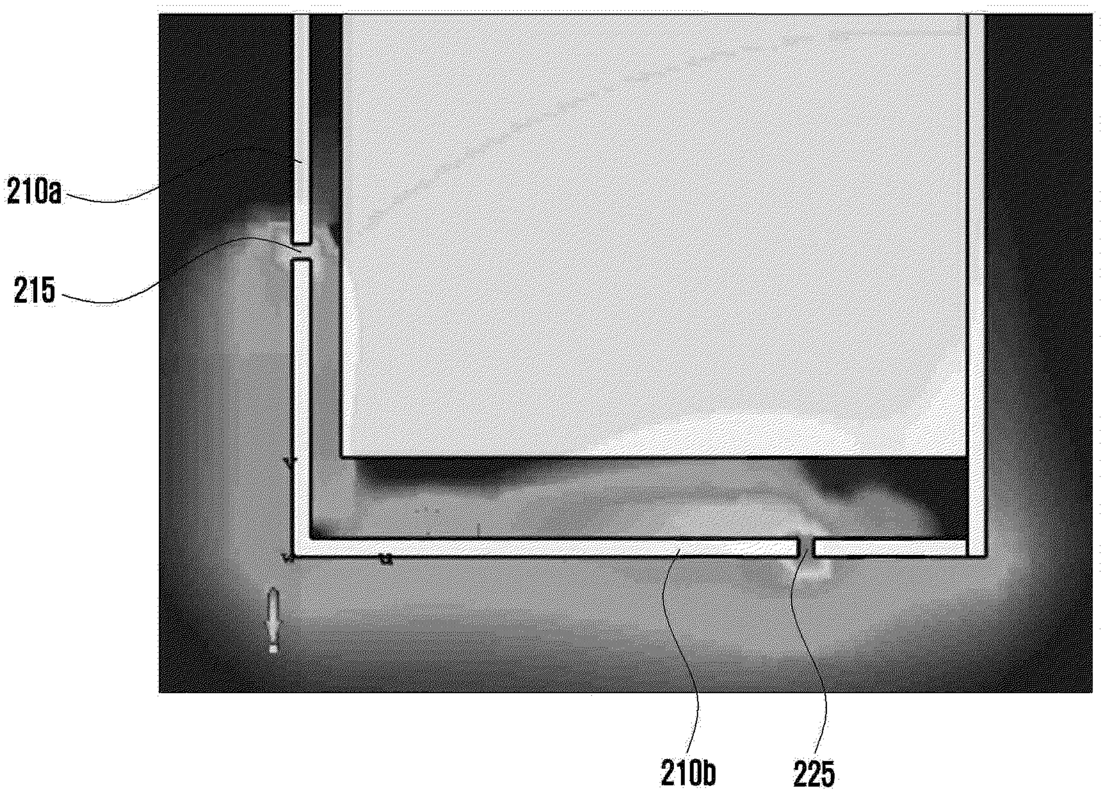
FIG. 6 is a diagram illustrating an electric field when the antenna of the foldable electronic device uses a second area between a first point and a second segmentation portion as a main radiation area according to an embodiment of the disclosure.

FIG. 6 is a diagram illustrating an electric field when the antenna of the foldable electronic device uses a second area between a first point and a second segmentation portion as a main radiation area according to an embodiment of the disclosure.

Figure 7:
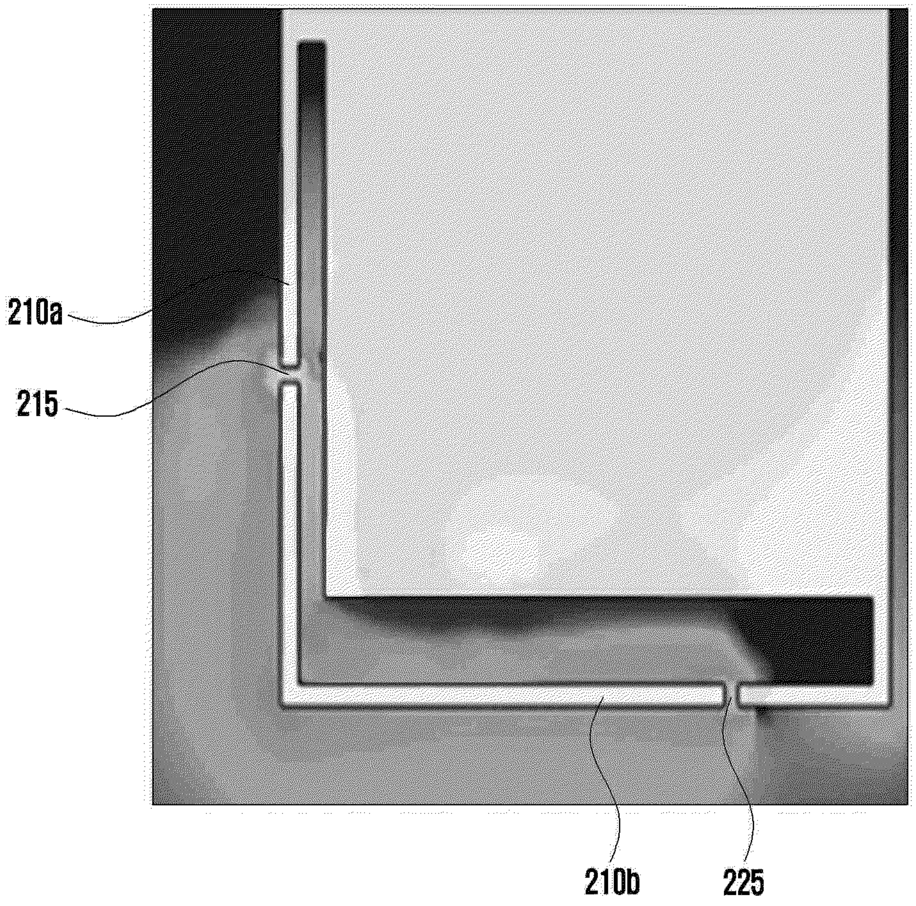
FIG. 7 is a diagram illustrating an electric field when the antenna of the foldable electronic device uses a first area between a first segmentation portion and a second point as a main radiation area according to an embodiment of the disclosure.

FIG. 7 is a diagram illustrating an electric field when the antenna of the foldable electronic device uses a first area between a first segmentation portion and a second point as a main radiation area according to an embodiment of the disclosure.

Figure 8:
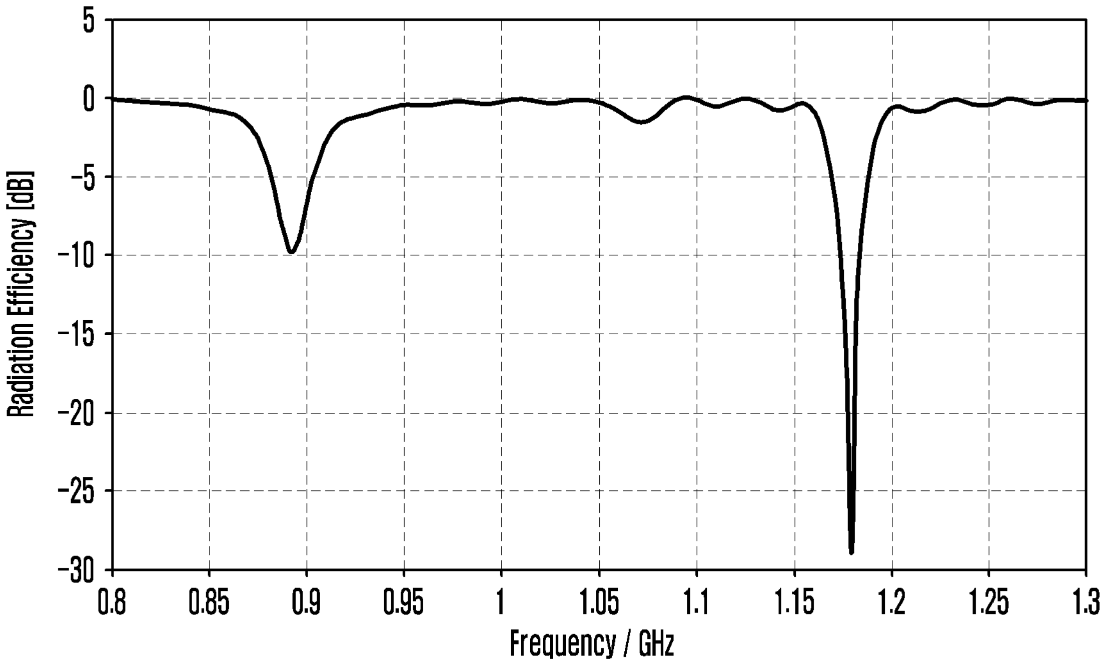
FIG. 8 is a diagram illustrating that radiation of an antenna of a foldable electronic device is performed through a first area between a first segmentation portion and a second point and a second area between the first point and a second segmentation portion according to an embodiment of the disclosure.

FIG. 8 is a diagram illustrating that radiation of an antenna of a foldable electronic device is performed through a first area between a first segmentation portion and a second point and a second area between a first point and a second segmentation portion according to an embodiment of the disclosure.

In the description of FIGS. 4 to 8, the same reference numerals are assigned to components identical to those of FIGS. 2A, 2B, 3A, and 3B described above, and redundant descriptions of functions and arrangements thereof may be omitted.

Referring to FIG. 4, the antenna 240 of the foldable electronic device 200 according to various embodiments of the disclosure may include a power supply unit 250*f*, a first matching circuit S1, and a second matching circuit S2. According to an embodiment, the first matching circuit S1 and the second matching circuit S2 provided on one side and the other side of the power supply unit 250*f* may adjust the electrical length of the antenna 240 according to an on/off operation. The antenna 240 may use the first area 241, which is a conductive portion between the first segmentation portion 215 and the second point 252, as a main radiation area, or it may use the second area 242, which is a conductive portion between the first point 251 and the second segmentation portion 225, as the main radiation area, as the matching values of the first matching circuit S1 and the second matching circuit S2 are adjusted through the processor 120 (or the communication module 190). The antenna 240 may operate in, for example, a low band (e.g., about 600 MHz to 1200 MHz) frequency band by adjusting the matching values of the first matching circuit S1 and the second matching circuit S2.

According to various embodiments, the antenna 240 of the foldable electronic device 200 may radiate a wireless signal through a first area 241 between the first segmentation portion 215 and the second point 252 and the second area 242 between the first point 251 and the second segmentation portion 225.

Referring to FIG. 5, an electric field may be identified when the antenna 240 of the foldable electronic device 200 performs radiation through a first area 241 between the first segmentation portion 215 and the second point 252, and a second area 242 between a first point 251 and the second segmentation portions 225. The electric field of FIG. 5 may indicate the electric fields of the first segmentation portion 215 and the second segmentation portion 225, when the foldable electronic device 200 is in a folded state (e.g., FIG. 3B), in the case that the first segmentation portion 215 and the fourth segmentation portion 315 are vertically aligned, and the second segmentation portion 225 and the third segmentation portion 235 are vertically aligned.

According to various embodiments, when the foldable electronic device 200 is in a folded state (e.g., FIG. 2B), radiation performance of the antenna 240 may be degraded if the first segmentation portion 215 formed on the first side surface 210*a* of the first housing 210 overlaps with the fourth side surface 220*a* of the second housing 220 formed of a conductive material. In this case, the processor 120 (or the communication module 190) may select one of the first area 241 between the first segmentation portion 215 and the second point 252 of the antenna 240 and the second area 242 between the first point 251 and the second segmentation portion 225 as a main radiation area by adjusting the matching values of the first matching circuit S1 and the second matching circuit S2. For example, the processor 120 (or the communication module 190) may use the second area 242 between the first point 251 and the second segmentation portion 225 as the main radiation area by adjusting the electrical path of the antenna 240 to the first length L1 through turning on the first matching circuit S1 and operating the second matching circuit S2 in an insulation mode (e.g., an open state). As another example, impedance matching may be performed using at least one lumped element included in the first matching circuit S1 according to a frequency band supported by the antenna 240.

The electric field of FIG. 6, when the foldable electronic device 200 is in a folded state (e.g., FIG. 2B), may indicate the electric field of the second segmentation portion 225 in the case that the fourth side surface 220*a* of the second housing 220 made of a conductive material is adjacent to or overlaps with the top of the first segmentation portion 215, and the second segmentation portion 225 and the third segmentation portion 235 are vertically aligned.

Referring to FIG. 6, the electric field may be identified when the antenna 240 of the foldable electronic device 200 performs radiation using the second area 242 between the first point 251 and the second segmentation portion 225 as a main radiation area. For example, the first matching circuit S1 may operate in substantially the same manner as when the first switch included in the first matching circuit S1 is connected to an inductor having 1 nH and the first switch is on (short), and the second matching circuit S2 may operate in substantially the same manner as when the second switch included in the second matching circuit S2 is connected to the inductor having 56 nH and the second switch is off (open). In this case, in the antenna 240, the second area 242 between the first point 251 and the second segmentation portion 225 may be used as the main radiation area.

Referring to FIG. 8, the antenna 240 of the foldable electronic device 200 may operate in a low band (e.g., about 600 MHz to 1200 MHz) frequency band. For example, the antenna 240 may operate in a frequency band of about 0.85 gigahertz (GHz) to 0.9 GHz through the first area 241 between the first segmentation portion 215 and the second point 252, and it may operate in a frequency band of about 1.15 GHz to 1.2 GHz through the second area 242 between the first point 251 and the second segmentation portion 225. For example, as shown in FIG. 4, the antenna 240 may operate with a corresponding frequency resonance by a second length L2 that is an electrical path of the first area 241 formed between the first segmentation portion 215 and the second point 252 and a first length L1 that is an electrical path of the second area 242 formed between the first point 251 and the second segmentation portion 225. According to various embodiments, when the foldable electronic device 200 is in an unfolded state (e.g., FIGS. 2A and 3A) or a folded state (e.g., FIGS. 2B and 3B), if the second segmentation portion 225 formed on the side surface 210*b* of the first housing 210 is gripped by a user's palm or finger, the radiation performance of the antenna 240 may be degraded. In this case, the processor 120 (or the communication module 190) may select one of the first area 241 between the first segmentation portion 215 and the second point 252 and the second area 242 between the first point 251 and the second segmentation portion 225 as a main radiation area by adjusting the matching values of the first matching circuit S1 and the second matching circuit S2. For example, the processor 120 (or the communication module 190) may use the first area 241 between the first segmentation portion 215 and the second point 252 as the main radiation area by adjusting the electrical path of the antenna 240 to the second length L2 through turning on the second matching circuit S2 and operating the first matching circuit S1 in an insulation mode (e.g., an open state).

In various embodiments, with reference to FIG. 4, the antenna 240 may operate at the first resonant frequency using a first length L1 that is an electrical path formed in the second area 242 between the first point 251 and the second segmentation portion 225. The antenna 240 may operate at the second resonant frequency using the second length L2 that is an electrical path formed in the first area 241 between the first segmentation portion 215 and the second point 252.

The electric field of FIG. 7 may indicate an electric field of the first segmentation portion 215, when the foldable electronic device 200 is in an unfolded state (e.g., FIGS. 2A and 3A) or a folded state (e.g., FIGS. 2B and 3B), in the case that the second segmentation portion 225 formed on the second side 210*b* of the first housing 210 is gripped by the user's palm or finger.

Referring to FIG. 7, the antenna 240 of the foldable electronic device 200, as described through FIG. 4, the electric field may be identified when radiation is performed by using the first area 241 between the first segmentation portion 215 and the second point 252 as a main radiation area. For example, the first matching circuit S1 may operate in substantially the same manner as when the first switch included in the first matching circuit S1 is connected to an inductor having 56 nH and the first switch is off (open) and the second matching circuit S2 may operate in substantially the same manner as when the second switch included in the second matching circuit S2 is connected to the inductor having 1 nH and the second switch is on (short). In this case, the antenna 240 may use the first area 241 between the first segmentation portion 215 and the second point 252 as the main radiation area.

Figure 9:
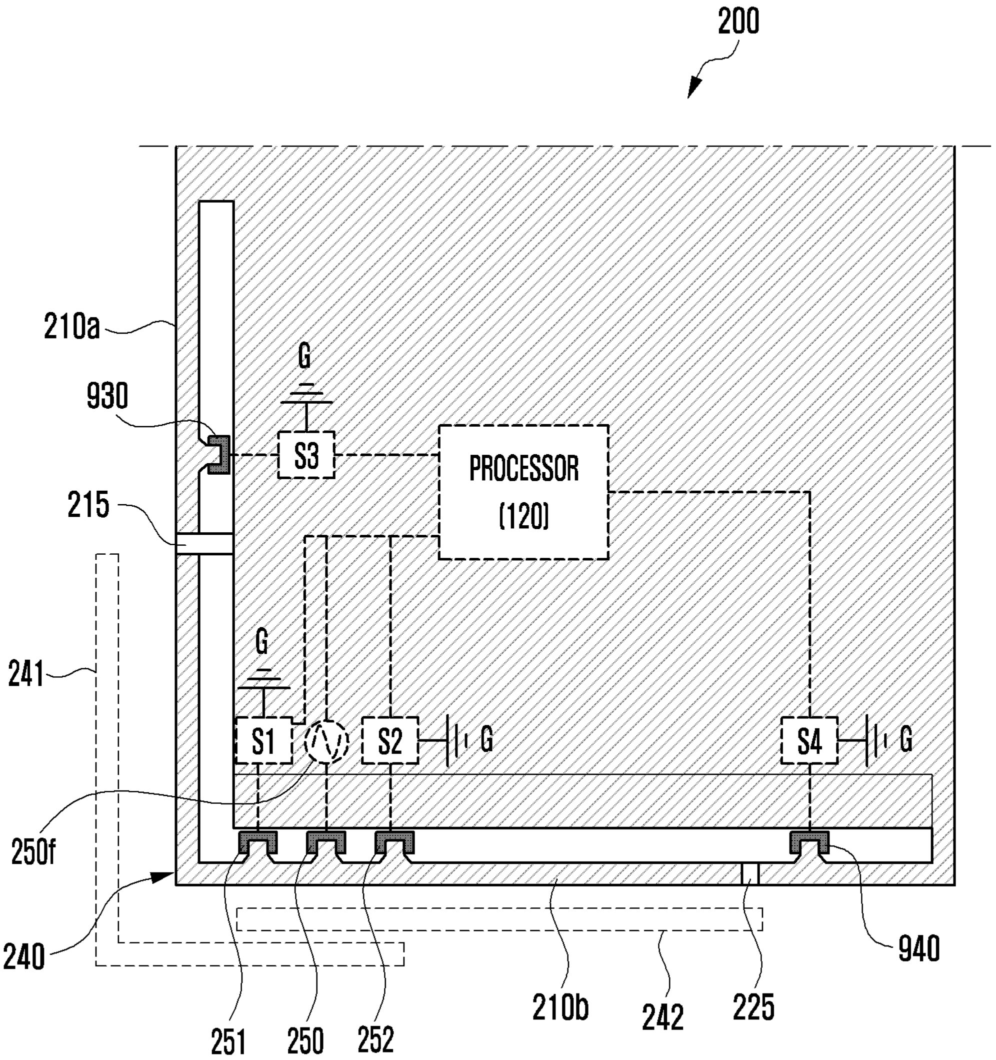
FIG. 9 is a diagram illustrating an operation according to matching value adjustment of a third matching circuit S3 and a fourth matching circuit S4 of the antenna of the foldable electronic device according to an embodiment of the disclosure.

FIG. 9 is a diagram illustrating an operation according to matching value adjustment of a third matching circuit S3 and a fourth matching circuit S4 of the antenna of the foldable electronic device according to an embodiment of the disclosure.

Figure 10:
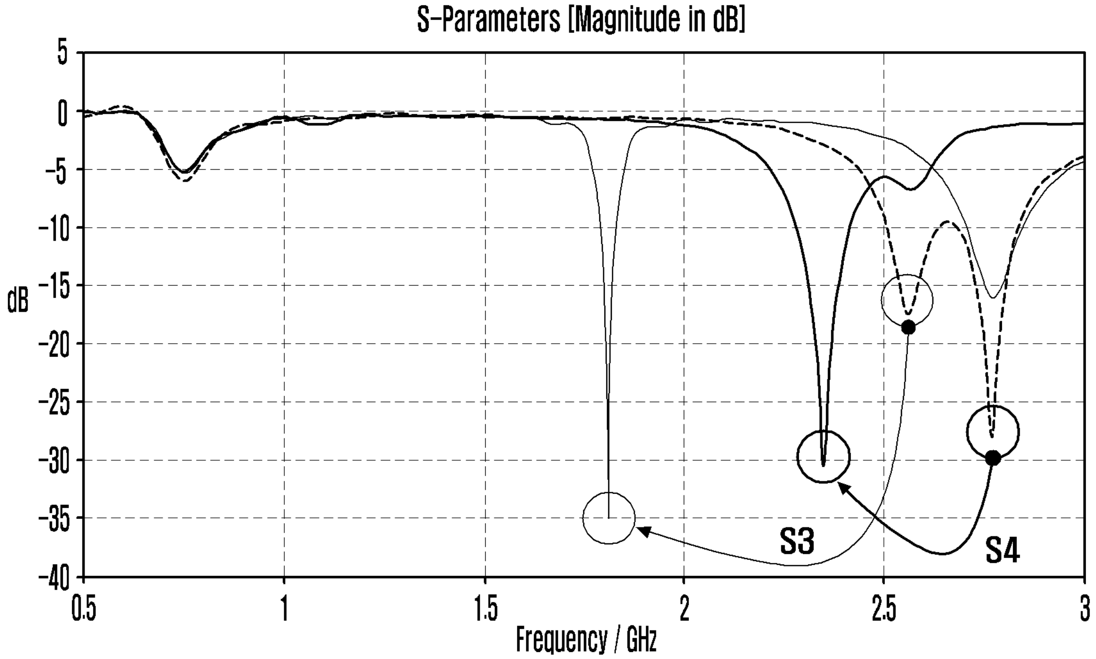
FIG. 10 is a diagram illustrating S-parameters explaining a change in a frequency band through switching of a third matching circuit S3 and a fourth matching circuit S4 of an antenna of a foldable electronic device according to an embodiment of the disclosure.

FIG. 10 is a diagram illustrating S-parameters explaining a change in frequency band through switching of a third matching circuit S3 and a fourth matching circuit S4 of an antenna of a foldable electronic device according to an embodiment of the disclosure.

In the description of FIG. 9, substantially the same reference numerals are assigned to components identical to those of FIG. 4 described above, and redundant descriptions of functions and arrangements thereof may be omitted.

Referring to FIG. 9, the antenna 240 of the foldable electronic device 200 according to various embodiments of the disclosure may include a power supply unit 250*f*, a first matching circuit S1, and a second matching circuit S2. The first matching circuit S1 and the second matching circuit S2 provided on one side and the other side of the power supply unit 250*f* may adjust the electrical length of the antenna 240 according to an on/off operation. The antenna 240 may select the first area 241, which is a conductive portion between the first segmentation portion 215 and the second point 252, as a main radiation area, or the second area 242, which is a conductive portion between the first point 251 and the second segmentation portion 225, as the main radiation area, as the matching values of the first matching circuit S1 and the second matching circuit S2 are adjusted through the processor 120 (or the communication module 190). The antenna 240 may operate in, for example, a low band (e.g., about 600 MHz to 1200 MHz) frequency band by adjusting the matching values of the first matching circuit S1 and the second matching circuit S2. The antenna 240 of the foldable electronic device 200 may perform radiation of the wireless signal through the first area 241 between the first segmentation portion 215 and the second point 252 and the second area 242 between the first point 251 and the second segmentation portion 225. According to an embodiment, the power supply unit 250*f*, the first matching circuit S1, and the second matching circuit S2 may be positioned between the first segmentation portion 215 and the second segmentation portion 225.

According to an embodiment, the power supply unit 250*f* may be disposed between the first matching circuit S1 and the second matching circuit S2. The power supply unit 250*f* may be connected to the power supply point 250 located on the second side surface 210*b*. The first matching circuit S1 may be connected to a first point 251 closer to the first side surface 210*a* than the power supply point 250. In an embodiment, the first point 251 may be disposed adjacent to the first segmentation portion 215 formed on the first side surface 210*a*. The second matching circuit S2 may be connected to a second point 252 farther from the first side surface 210*a* than the power supply point 250. In an embodiment, the second point 252 may be located closer to the second segmentation portion 225 formed on the second side surface 210*b* than the first segmentation portion 215 formed on the first side surface 210*a*.

According to various embodiments, the third matching circuit S3 may be located on the first side surface 210*a* opposite to the first matching circuit S1 with respect to the first segmentation portion 215. The third matching circuit S3 may be connected to a third point 930 located on the first side surface 210*a* in the opposite direction to the first point 251 based on the first segmentation portion 215. For example, the first segmentation portion 215 may be located between the first point 251 and the third point 930. The fourth matching circuit S4 may be located on the second side surface 210*b* in the opposite direction to the second matching circuit S2 based on the second segmentation portion 225. The fourth matching circuit S4 may be connected to the fourth point 940 located on the second side surface 210*b* in the opposite direction to the second point 252 based on the second segmentation portion 225. For example, the second segmentation portion 225 may be located between the second point 252 and the fourth point 940.

According to various embodiments, the third matching circuit S3 and the fourth matching circuit S4 may be electrically connected to the processor 120 (or the communication module 190). The antenna 240 may be switched to operate in a frequency band of, for example, mid band (e.g., about 1500 MHz to 2200 MHz) and/or high band (e.g., about 2300 MHz to 2700 MHz) by adjusting the matching values of the third matching circuit S3 and the fourth matching circuit S4 through the processor 120 (or the communication module 190).

Referring to FIG. 10, the antenna 240 may be switched from, for example, a high band frequency band of about 2.6 GHz to 2.62 GHz to a mid band frequency band of about 1.75 GHz to 1.8 GHz by adjusting the matching value of the third matching circuit S3. The antenna 240 may be switched from, for example, a high band frequency band of about 2.65 GHz to 2.7 GHz to a high band frequency band of about 2.35 GHz to 2.4 GHz by adjusting the matching value of the fourth matching circuit S4. In this case, even if the frequency band is switched to the mid band and/or high band through the adjustment of the matching values of the third matching circuit S3 and the fourth matching circuit S4, the antenna 240 may identify that the low band (e.g., about 0.6 GHz to 0.8 GHz) frequency band is not affected by adjusting the matching value of the first matching circuit S1 and the second matching circuit S2.

According to various embodiments, the third matching circuit S3 may include a third switch (e.g., the switch 1310 of FIG. 13) and/or at least one lumped element (e.g., the passive elements 1320 of FIG. 13). The fourth matching circuit S4 may include a fourth switch (e.g., the switch 1310 of FIG. 13) and/or at least one lumped element (e.g., the passive elements 1320 of FIG. 13). For example, at least one lumped element may include a capacitor or an inductor.

Figure 11A:
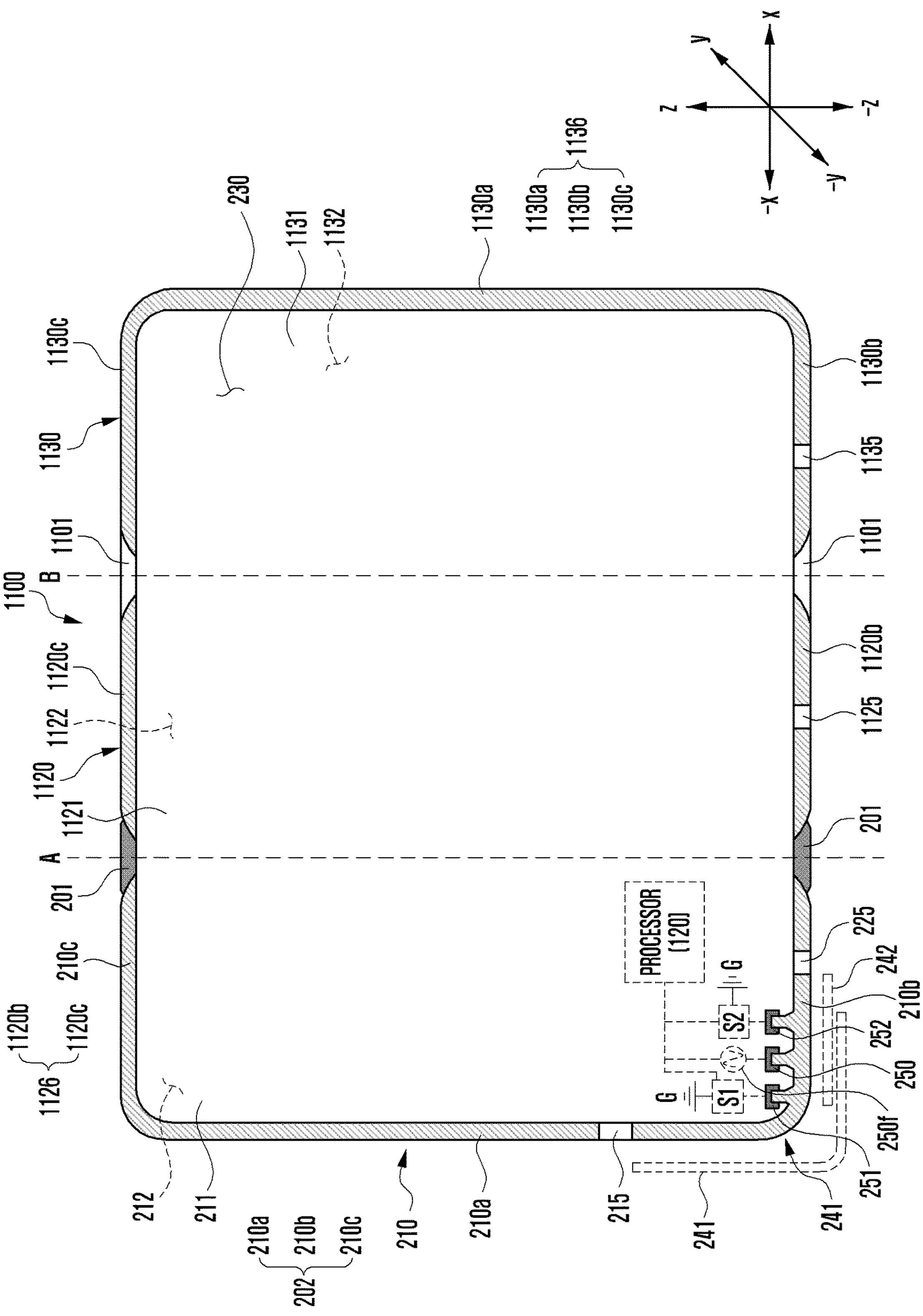
FIG. 11A is a diagram schematically illustrating an unfolded state of a multi-foldable electronic device according to an embodiment of the disclosure.
Figure 11B:
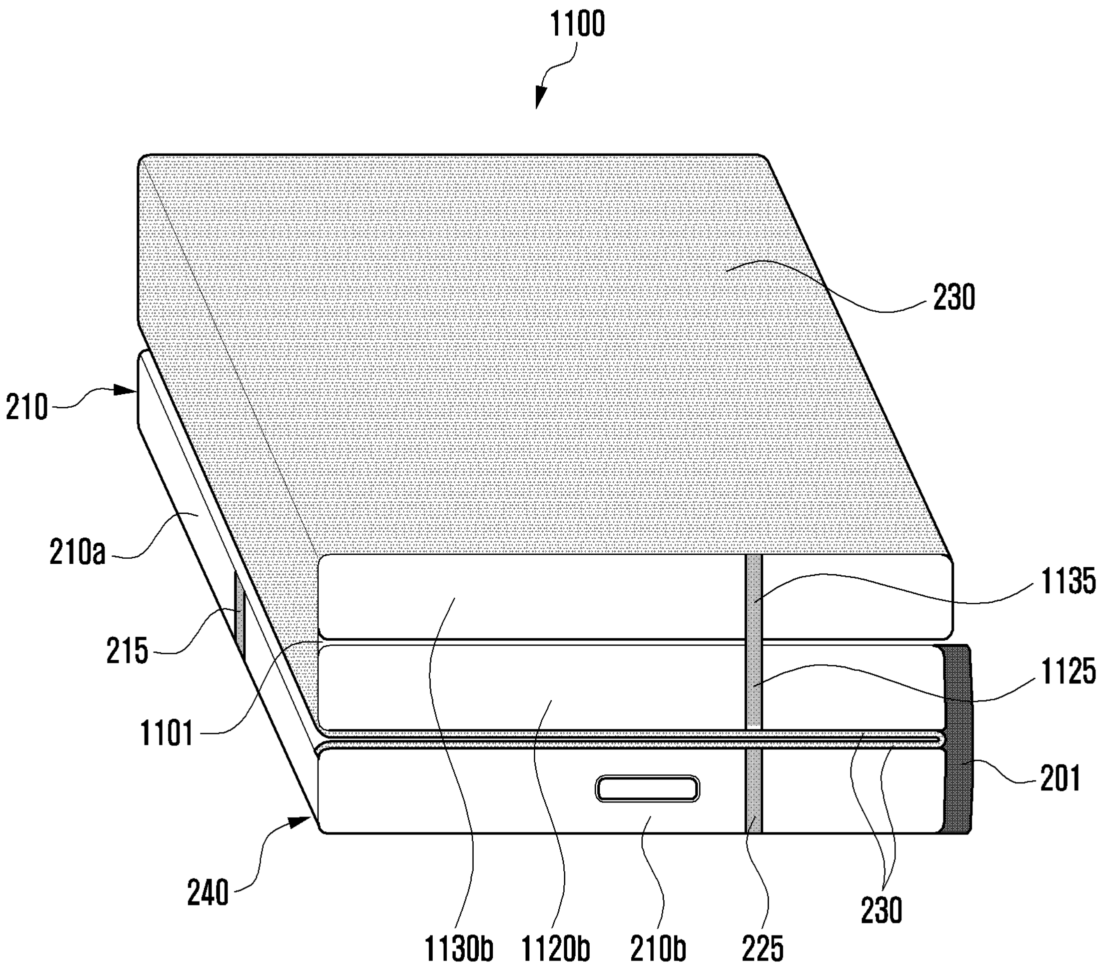
FIG. 11B is a diagram schematically illustrating a folded state of a multi-foldable electronic device according to an embodiment of the disclosure.

FIG. 11A is a diagram schematically illustrating an unfolded state of a multi-foldable electronic device according to an embodiment of the disclosure. FIG. 11B is a diagram schematically illustrating a folded state of a multi-foldable electronic device according to an embodiment of the disclosure.

The multi-foldable electronic device 1100 of FIGS. 11A and 11B may include the electronic device 101 disclosed in FIG. 1. The multi-foldable electronic device 1100 may include at least one of components included in the electronic device 101 shown in FIG. 1.

The embodiment disclosed in FIGS. 11A and 11B may include at least some of the descriptions disclosed in FIGS. 2A, 2B, 3A, 3B, and 4 to 10 described above. In the description of FIGS. 11A and 11B, the same reference numerals are assigned to components substantially the same as those of FIGS. 2A, 2B, 3A, 3B, and 4 to 10 described above, and redundant description of functions and operations thereof may be omitted.

Referring to FIGS. 11A and 11B, the multi-foldable electronic device 1110 according to various embodiments of the disclosure may include a first housing 210, a second housing 1120, and a third housing 1130 forming an unfolded state or a folded state based on a hinge module 201 and a folding part 1101.

According to an embodiment, the first housing 210 and the second housing 1120 may be rotatably coupled around the first folding axis A through the hinge module 201. The first housing 210 and the second housing 1120 may be folded in an in-folding method so that the flexible display 230 is not visually exposed to the outside of the multi-foldable electronic device 1100 in a folded state (e.g., FIG. 11B). In the case that the first housing 210 and the second housing 1120 are folded in an in-folding manner, the flexible displays 230 disposed on the first housing 210 and the second housing 1120 may be folded inward to face each other.

According to an embodiment, the second housing 1120 and the third housing 1130 may be rotatably coupled around the second folding axis B through the folding part 1101. The second housing 1120 and the third housing 1130 may be folded in an out-folding method so that the flexible display 230 is visually exposed to the outside of the multi-foldable electronic device 1100 in a folded state (e.g., FIG. 11B). In the case that the second housing 1120 and the third housing 1130 are folded in an out-folding manner, the flexible displays 230 disposed on the second housing 1120 and the third housing 1130 may be folded outward not to face each other.

According to various embodiments, when the multi-foldable electronic device 1100 is in an unfolded state (e.g., FIG. 11A), the first housing 210, the second housing 1120, and the third housing 1130 may form an angle of about 180° to be substantially flat. When the multi-foldable electronic device 1100 is in a folded state (e.g., FIG. 11B), the first housing 210, the second housing 1120, and the third housing 1130 may be disposed to overlap one another.

According to an embodiment, the multi-foldable electronic device 1100 may include a flexible display 230 (e.g., a foldable display) disposed in a space formed by the first housing 210, the second housing 1120, and the third housing 1130. In an embodiment, the flexible display 230 disposed in the space formed by the first housing 210, the second housing 1120, and the third housing 1130 may include one display or at least two displays.

According to various embodiments, the first housing 210, in an unfolded state, may include a first surface 211 facing a first direction (e.g., a front direction, a z-axis direction) and a second surface 212 facing a second direction (e.g., a rear direction, a −z axis direction) opposite to the first surface 211. According to an embodiment, the second housing 1120, in an unfolded state, may include a third surface 1121 facing a first direction (e.g., a front direction, a z-axis direction) and a fourth surface 1122 facing a second direction (e.g., a rear direction and a −z-axis direction) opposite to the third surface 1121. According to an embodiment, the third housing 1130, in an unfolded state, may include a fifth surface 1131 facing a first direction (e.g., a front direction, a z-axis direction) and a sixth surface 1132 facing a second direction (e.g., a rear direction and a −z-axis direction) opposite to the fifth surface 1131.

According to an embodiment, when the multi-foldable electronic device 1100 is in an unfolded state, the first surface 211 of the first housing 210, the third surface 1121 of the second housing 1120, and the fifth surface 1131 of the housing 1130 may face substantially the same first direction (e.g., a front direction, a z-axis direction). The multi-foldable electronic device 1100, in a folded state, may operate in a method where the first surface 211 of the first housing 210 and the third surface 1121 of the second housing 1120 may face each other, and the fourth surface 1122 of the second housing 1120 and the sixth surface 1132 of the third housing 1130 may face each other.

According to various embodiments, the multi-foldable electronic device 1100 may include a first surface (e.g., a top surface or a front surface) on which the flexible display 230 is disposed, a second surface (e.g., a bottom surface or a rear surface) opposite to the first surface, and a side surface surrounding the first surface and the second surface.

According to an embodiment, the first housing 210 may include a first lateral member 202 that at least partially forms the exterior of the multi-foldable electronic device 1100. The second housing 1120 may include a second lateral member 1126 that at least partially forms the exterior of the multi-foldable electronic device 1100. The third housing 1130 may include a third lateral member 1136 that at least partially forms the exterior of the multi-foldable electronic device 1100.

In an embodiment, the first lateral member 202, the second lateral member 1126, and the third lateral member 1136 may be formed using a conductive material (e.g., a metal).

According to various embodiments, the first housing 210 and the second housing 1120 may be disposed on both sides of the first folding axis A and have a substantially symmetrical shape with respect to the first folding axis A. The second housing 1120 and the third housing 1130 may be disposed on both sides of the second folding axis B and have a substantially symmetrical shape with respect to the second folding axis B.

According to various embodiments, the first housing 210 and the second housing 220 may have an asymmetrical shape with respect to the first folding axis A. The second housing 1120 and the third housing 1130 may have an asymmetrical shape with respect to the second folding axis B.

According to an embodiment, the first housing 210 may be coupled to the first lateral member 202 and include a first rear surface cover (not shown) which forms at least a portion of the second surface 212 of the multi-foldable electronic device 1100. For example, the first lateral member 202 may include a first side surface 210*a* disposed substantially parallel to the first folding axis A, a second side surface 210*b* extending in a direction substantially perpendicular to the first folding axis A from one end of the first side surface 210*a*, and a third side surface 210*c* extending in a direction substantially perpendicular to the first holding axis A from the other end of the first side surface 210*a*.

According to an embodiment, the second housing 1120 may be combined with the second lateral member 1126 and include a second rear surface cover (not shown) that forms at least a portion of the fourth surface 1122 of the multi-foldable electronic device 1100. For example, the second lateral member 1126 may include a fourth side surface 1120*b* disposed substantially parallel to the second side surface 210*b* of the first lateral member 202 and a fifth side surface 1120*c* disposed substantially parallel to the third side surface 210*c* of the first lateral member 202.

According to an embodiment, the third housing 1130 may be combined with the third lateral member 1136 and include a third rear surface cover (not shown) that forms at least a portion of the sixth surface 1132 of the multi-foldable electronic device 1100). For example, the third lateral member 1136 may include a sixth side surface 1130*a* disposed substantially parallel to the second folding axis B, a seventh side surface 1130*b* extending toward the fourth side surface 1120*b* of the second lateral member 1126 in a direction substantially perpendicular to the second folding axis B from one end of the sixth side surface 1130*a*, and an eighth side surface 1130*c* extending toward the fifth side surface 1120*c* of the second lateral member 1126 in the direction substantially perpendicular to the second folding axis B from the other end of the sixth side surface 1130*a*.

According to various embodiments, when the multi-foldable electronic device 1100 is in an unfolded state (e.g., FIG. 11A), the second side surface 210*b* of the first lateral member 202, the fourth side surface 1120*b* of the second lateral member 1126, and the seventh side surface 1130*b* of the third lateral member 1136 may be disposed substantially in parallel, and the third side surface 210*c* of the first lateral member 202, the fifth side surface 1120*c* of the second lateral member 1126, and the eighth side surface 1130*c* of the third lateral member 1136 may be disposed substantially in parallel.

According to an embodiment, the first side surface 210*a* of the first lateral member 202 may include a first segmentation portion 215. For example, the first segmentation portion 215 may separate a portion of the first side surface 210*a*. The second side surface 210*b* of the first lateral member 202 may include a second segmentation portion 225. For example, the second segmentation portion 225 may separate a portion of the second side surface 210*b*. The fourth side surface 1120*b* of the second lateral member 1126 may include a third segmentation portion 1125. For example, the third segmentation portion 1125 may separate a portion of the fourth side surface 1120*b*. The seventh side surface 1130*b* of the third lateral member 1136 may include a fourth segmentation portion 1135. For example, the fourth segmentation portion 1135 may separate a portion of the seventh side surface 1130*b*. Each of the first segmentation portion 215, the second segmentation portion 225, the third segmentation portion 1125, and the fourth segmentation portion 1135 may be formed in a slit shape.

According to an embodiment, the second segmentation portion 225 formed on the second side surface 210*b* and the third segmentation portion 1125 formed on the fourth side surface 1120*b* may be formed on a first side (e.g., a left side) and a second side (e.g., a right side) based on the hinge module 201. The third segmentation portion 1125 formed on the fourth side surface 1120*b* and the fourth segmentation portion 1135 formed on the seventh side surface 1130*b* may be disposed on the first side (e.g., a left side) and the second side (e.g., a right side) based on the folding part 1101.

According to an embodiment, when the multi-foldable electronic device 1100 is in a folded state (e.g., FIG. 11B), the second segmentation portion 225, the third segmentation portion 1125, and the fourth segmentation portion 1135, when viewed from the top of the first surface, may be disposed to overlap vertically. The vertical overlapping of the second segmentation portion 225, the third segmentation portion 1125, and the fourth segmentation portion 1135 may reduce degradation of radiation performance of the antenna 240.

According to an embodiment, a portion of the first side surface 210*a* separated through the first segmentation portion 215 and a portion of the second side surface 210*b* separated through the second segmentation portion 225 may operate as an antenna radiator and form the antenna 240 by being electrically connected to the processor 120 (or communication module 190) in the multi-foldable electronic device 1100. For example, a portion of the first side surface 210*a* and a portion of the second side surface 210*b* may be a conductive portion (e.g., an antenna 240 radiator) extending from the first segmentation portion 215 to the second segmentation portion 225. At least a portion of the conductive portion may operate as a radiator of the antenna 240.

According to an embodiment, the antenna 240 may include a power supply unit 250*f*, a first matching circuit S1, and a second matching circuit S2. In an embodiment, the power supply point 250, the first point 251, and the second point 252 may be disposed on the second side surface 210*b* of the first housing 210.

According to various embodiments, the power supply unit 250*f* may be connected to the power supply point 250 located on the second side surface 210*b*. The first matching circuit S1 may be connected to a first point 251 closer to the first side surface 210*a* than the power supply point 250. For example, the first matching circuit S1 may be disposed on one side (e.g., the left side) of the power supply unit 250*f*. In an embodiment, the first point 251 may be disposed adjacent to the first segmentation portion 215 formed on the first side surface 210*a*. The second matching circuit S2 may be connected to a second point 252 farther from the first side surface 210*a* than the power supply point 250. For example, the second point 252 may be located on the other side (e.g., the right side) of the power supply unit 250*f*. In an embodiment, the second point 252 may be located adjacent to the second segmentation portion 225 formed on the second side surface 210*b*.

According to various embodiments, the first matching circuit S1 and the second matching circuit S2 may convert the frequency band of the antenna 240 by adjusting the matching value through the processor 120 (or the communication module 190). As the matching value of the first matching circuit S1 and/or the second matching circuit S2 is adjusted, the antenna 240 may use the first area 241, which is a conductive portion between the first segmentation portion 215 and the second point 252, as a main radiation area, or use the second area 242, which is a conductive portion between the first point 251 and the second segmentation portion 225, as the main radiation area.

For example, when the multi-foldable electronic device 1100 is in a folded state (e.g., FIG. 11B), radiation performance of the antenna 240 may be degraded in the case that the first segmentation portion 215 formed on the first side surface 210*a* of the first housing 210 is adjacent to or overlaps with the display 230 disposed on at least a portion of the second housing 1120 and the third housing 1130. In this case, the processor 120 (or the communication module 190) may transmit and receive the wireless signal using the second area 242, which is a conductive portion between the first point 251 and the second segmentation portion 225, as a main radiation area by turning on the first matching circuit S1 and adjusting the electrical path of the antenna 240.

According to various embodiments, when the multi-foldable electronic device 1100 is in an unfolded state (e.g., FIG. 11A) or a folded state (e.g., FIG. 11B), the radiation performance of the antenna 240 may be degraded if the first segmentation portion 215 formed on the first side surface 210*a* of the first housing 210 is gripped by a user's fingers. In this case, the communication module 190 may transmit and receive the wireless signal using the second area 242, which is a conductive portion between the first point 251 and the second segmentation portion 225, as a main radiation area by adjusting the electrical path of the antenna 240 through turning on the first matching circuit S1 and turning off the second matching circuit S2. According to various embodiments, the multi-foldable electronic device 1100 may include a recess (not shown) formed to accommodate the flexible display 230 through structural coupling of a first housing 210 (e.g., a first lateral member 202), a second housing 1120 (e.g., a second lateral member 1126), and a third housing 1130 (e.g., a third lateral member 1136). The multi-foldable electronic device 1100 may include a printed circuit board (not shown) inside at least one of the first housing 210, the second housing 1120, and the third housing 1130. In the printed circuit board, a processor 120, a memory 130, an input module 150, an audio output module 155, an audio module 170, a sensor module 176, a haptic module 179, a camera module 180, and/or a communication module 190, shown in FIG. 1, may be disposed. At least a portion of the first housing 210, the second housing 1120, and the third housing 1130 may be formed of a metal material or a non-metal material to support the flexible display 230.

Figure 12A:
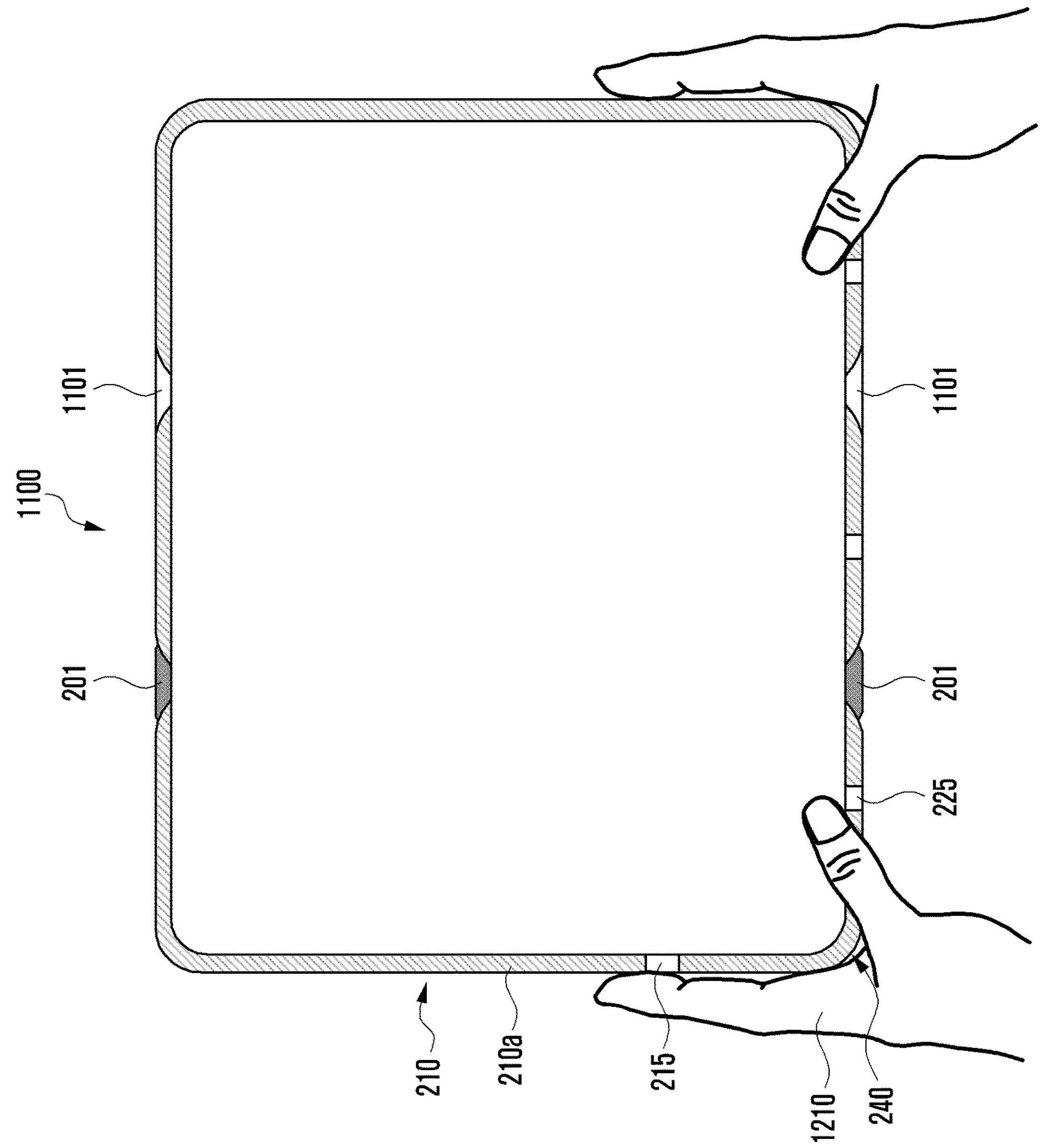
FIG. 12A is a diagram explaining an antenna operation when the multi-foldable electronic device of FIG. 11A is used in a landscape mode according to an embodiment of the disclosure.
Figure 12B:
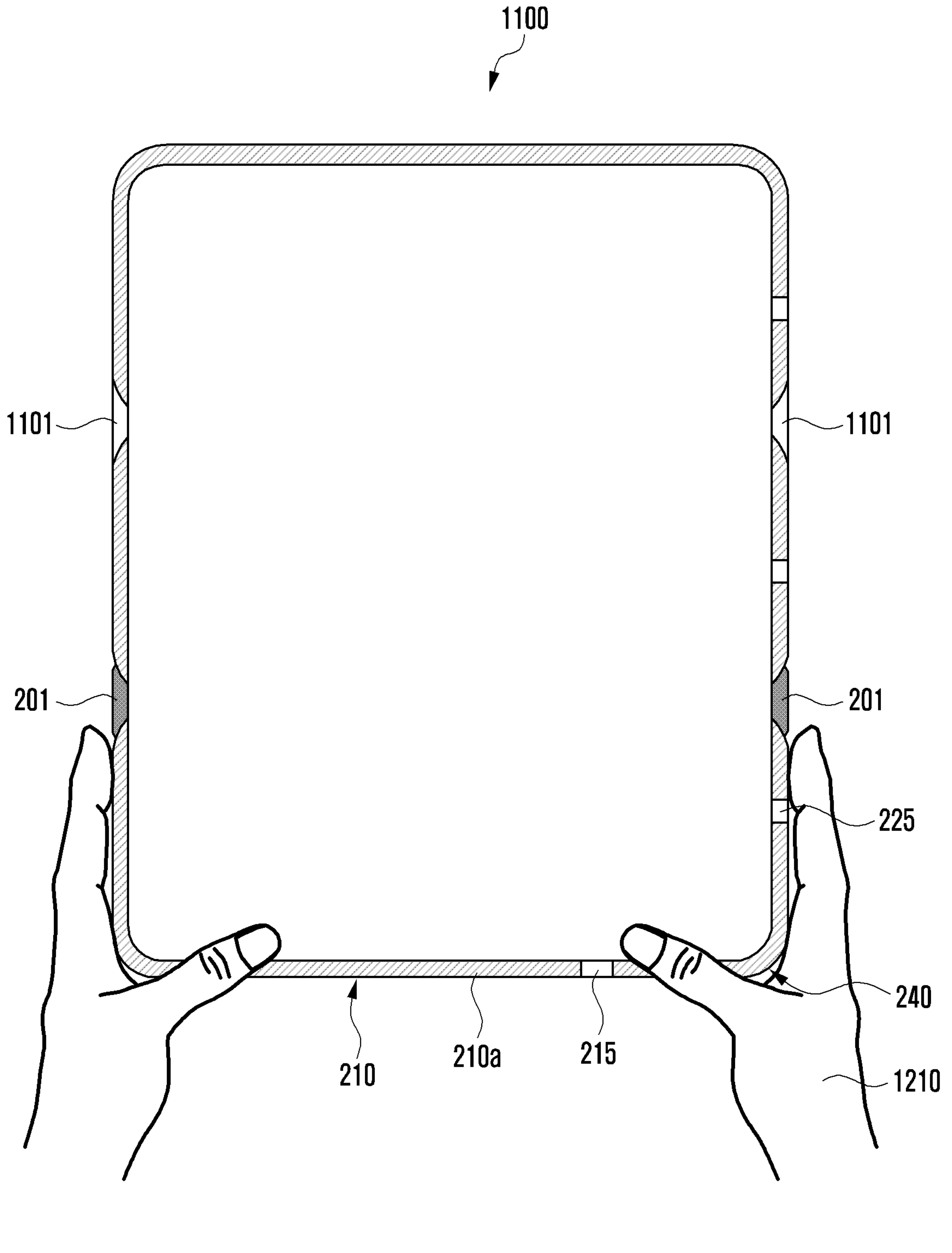
FIG. 12B is a diagram explaining an antenna operation when the multi-foldable electronic device of FIG. 11A is used in a portrait mode according to an embodiment of the disclosure.

FIG. 12A is a diagram explaining an antenna operation when the multi-foldable electronic device of FIG. 11A is used in a landscape mode according to an embodiment of the disclosure. FIG. 12B is a diagram explaining an antenna operation when the multi-foldable electronic device of FIG. 11A is used in a portrait mode according to an embodiment of the disclosure.

Referring to FIG. 12A, when the multi-foldable electronic device 1100 according to various embodiments of the disclosure is used in an unfolded state (e.g., a landscape mode), the first segmentation portion 215 formed on the first side surface 210*a* of the housing 210 may be gripped by the user's fingers 1210. In this case, as described through FIG. 11A, in the antenna 240, radiation performance through the first area 241, which is a conductive portion between the first segmentation portion 215 and the second point 252, may be degraded.

According to an embodiment, the processor 120 (or the communication module 190), as described through FIGS. 4 and 11A, may adjust the electrical path of the antenna 240 by adjusting the matching value through turning on the first matching circuit S1 and operating the matching circuit S2 in an insulation mode (e.g., an open state). In the case that the first matching circuit S1 is turned on, the antenna 240 may perform radiation by operating the second area 242, which is a conductive portion between the first point 251 and the second segmentation portion 225, as a main radiation area.

Referring to FIG. 12B, when the multi-foldable electronic device 1100 according to various embodiments of the disclosure is used in an unfolded state (e.g., portrait mode), the second segmentation portion 225 formed on the second side surface 210*b* of the first housing 210 may be gripped by the user's fingers 1210. In this case, in the antenna 240, radiation performance through the second area 242, which is a conductive portion between the first point 251 and the second segmentation portion 225, may be degraded.

According to an embodiment, the communication module 190, as described through FIGS. 4 and 11A, may adjust the electrical path of the antenna 240 by adjusting the matching value through turning on the second matching circuit S2 and operating the first matching circuit S1 in the insulation mode (e.g., an open state). If the second matching circuit S2 is turned on, the antenna 240 may perform radiation by operating the first area 241 between the first segmentation portion 215 and the second point 252 as a main radiation area.

According to various embodiments, the foldable electronic device 200 or the multi-foldable electronic device 1100 according to various embodiments of the disclosure may reduce the performance degradation of the antenna by selecting and using one of the first area 241, which is a conductive portion between the first segmentation portion 215 and the second point 252 formed on the antenna 240, or the second area 242, which is a conductive portion between the first point 251 and the second segmentation portion 225, as a main radiation area.

According to various embodiments, the above-described embodiments have been described with respect to the foldable electronic device 200 and the multi-foldable electronic device 1100 as examples, but they may be applied to a bar-type electronic device, a rollable-type electronic device, and a wearable-type electronic device of electronic devices and/or tablet PCs.

FIG. 13 is a diagram illustrating the configuration of a matching circuit according to an embodiment of the disclosure.

According to various embodiments, the matching circuit disclosed in FIG. 13 may include the first matching circuit S1, the second matching circuit S2, the third matching circuit S3, and/or the fourth matching circuit S4 disclosed in FIG. 2A, 3A, 4, or 9.

Referring to FIG. 13, the first matching circuit S1, the second matching circuit S2, the third matching circuit S3, or the fourth matching circuit S4 may include at least one switch 1310 or a plurality of passive elements 1320 (D1, D2, . . . , Dn, open) having different element values that are electrically connected to a corresponding electrical path by the switch 1310 or disconnected from the electrical path.

According to an embodiment, the plurality of passive elements 1320 may include capacitors having various capacitance values and/or inductors having various inductance values.

According to an embodiment, at least one switch 1310 may be connected to an electrical path 1302 including an element having a designated element value under the control of a processor (e.g., the processor 120 of FIG. 2A). In some embodiments, the first matching circuit S1, the second matching circuit S2, the third matching circuit S3, or the fourth matching circuit S4 may disconnect the corresponding electrical path 1302 through the switch 1310.

According to an embodiment, at least one switch 1310 may include a micro-electro mechanical systems (MEMS) switch. Since the MEMS switch performs a mechanical switching operation by an internal metal plate and has perfect turn on/off characteristics, it may not substantially affect changes in radiation characteristics of the antenna. In some embodiments, at least one switch 1310 may include a single pole single throw (SPST) switch, a single pole double throw (SPDT) switch, or a switch including three or more throws.

A foldable electronic device 200 according to various embodiments of the disclosure may include a processor 120; a hinge module 201; a first housing 210 and a second housing 220, at least partially coupled to both sides of the hinge module 201, in an unfolded state or a folded state based on the hinge module 201; and a flexible display 230 disposed in a space formed by the first housing 210 and the second housing 220, wherein the first housing 210 includes a first lateral member 202 forming at least a portion of an exterior of the foldable electronic device 200, and the first lateral member 202 includes a first side surface 210*a* disposed parallel to a folding axis A of the hinge module 201, a second side surface 210*b* extending in a direction perpendicular to the folding axis A from one end of the first side surface 210*a*, and a third side surface 210*c* extending in the direction perpendicular to the folding axis A from the other end of the first side surface 210*a*, and the second housing 220 includes a second lateral member 204 forming at least a portion of the exterior of the foldable electronic device 200, and the second lateral member 204 includes a fourth side surface 220*a* disposed parallel to the folding axis A, a fifth side surface 220*b* extending in the direction perpendicular to the folding axis A from one end of the fourth side surface 220*a*, and a sixth side surface 220*c* extending in the direction perpendicular to the folding axis A from the other end of the fourth side surface 220*a*, wherein a first segmentation portion 215 is formed on the first side surface 210*a*, a second segmentation portion 225 is formed on the second side surface 210*b*, and a third segmentation portion 235 is formed on the fifth side surface 220*b*, wherein, in the case that the first housing 210 and the second housing 220 are in a folded state, the second segmentation portion 225 and the third segmentation portion 235 are disposed to overlap each other, and a portion of the first side surface 210*a* separated through the first segmentation portion 215 and a portion of the second side surface 210*b* separated through the second segmentation portion 225 are electrically connected to the processor 120 and operate as an antenna 240, wherein the antenna 240 includes a power supply unit 250*f* connected to a power supply point 250 disposed on the second side surface 210*b*, a first matching circuit S1 connected to a first point 251 located between the power supply point 250 and the first segmentation portion 215, and a second matching circuit S2 connected to a second point 252 located between the power supply point 250 and the second segmentation portion 225.

According to various embodiments, the foldable electronic device 200 may include further a fourth segmentation portion 315 formed on the fourth side surface 220*a*; and, when the first housing 210 and the second housing 220 are in a folded state, the first segmentation portion 215 and the fourth segmentation portion 315 may be disposed to overlap each other.

According to various embodiments, the first matching circuit S1 may include a first switch and/or at least one lumped element, and the second matching circuit S2 may include a second switch and/or at least one lumped element.

According to various embodiments, a lumped element may include a capacitor or an inductor.

According to various embodiments, the first matching circuit S1 or the second matching circuit S2 may be configured to adjust a matching value under the control of the processor 120.

According to various embodiments, when the first matching circuit S1 is turned on and the second matching circuit S2 is operated in an open state under the control of the processor 120, the antenna 240 may be configured to operate the second area 242, which is a conductive portion between the first point 251 and the second segmentation portion 225, as a main radiation area.

According to various embodiments, when the second matching circuit S2 is turned on and the first matching circuit S1 is operated in an open state under the control of the processor 120, the antenna 240 may be configured to operate the first area 241, which is a conductive portion between the first segmentation portion 215 and the second point 252, as a main radiation area.

According to various embodiments, the processor 120 may be configured for the antenna 240 to operate in a low band frequency band of 600 MHz to 1200 MHz by adjusting the matching values of the first matching circuit S1 and/or the second matching circuit S2.

According to various embodiments, the foldable electronic device 200 may include the third matching circuit S3 connected to the third point 930 located on the first side surface 210*a* in an opposite direction to the first matching circuit S1 based on the first segmentation portion 215 and a fourth matching circuit S4 connected to the fourth point 940 located on the second side surface 210*b* in an opposite direction to the second matching circuit S2 based on the second segmentation portion 225.

According to various embodiments, the processor 120 may be configured for the antenna 240 to operate in a mid band frequency band of 1500 MHz to 2200 MHz and/or in a high band frequency band of 2300 MHz to 2700 MHz by adjusting the matching values of the third matching circuit S3 and/or the fourth matching circuit S4.

A multi-foldable electronic device according to various embodiments of the disclosure may include a processor 120; a hinge module 201; a folding part 1101; a first housing 210 and a second housing 1120, at least partially coupled to both sides of the hinge module 201, that form an unfolded state or a folded state through an in-folding method based on a first folding axis A of the hinge module 201, and a third housing 1130 disposed in an opposite direction to the second housing based on a second folding axis B of the folding part 1101 and forming an unfolded state or a folded state through an out-folding method based on the second folding axis B; and a flexible display 230 disposed in a space formed by the first housing 210, the second housing 1120, and the third housing 1130, wherein the first housing 210 includes a first lateral member 202 forming at least a portion of an exterior of the multi-foldable electronic device 1100, and the first lateral member 202 includes a first side surface 210*a* disposed parallel to the first folding axis A of the hinge module 201, a second side surface 210*b* extending in a direction perpendicular to the first folding axis A from one end of the first side surface 210*a*, and a third side surface 210*c* extending in the direction perpendicular to the first folding axis A from the other end of the first side surface, the second housing 1120 includes a second lateral member 1126 forming at least a portion of the exterior of the multi-foldable electronic device 1100, and the second lateral member 1126 includes a fourth side surface 1120*b* disposed substantially parallel to the second side surface 210*b* of the first housing 210 and a fifth side surface 1120*c* disposed substantially parallel to the third side surface 210*c* of the first housing 210, and the third housing 1130 includes a third lateral member 1136 forming at least a portion of the exterior of the multi-foldable electronic device 1100, and the third lateral member 1136 includes a sixth side surface 1130*a* disposed parallel to the second folding axis B of the folding part 1101, a seventh side surface 1130*b* extending from one end of the sixth side surface 1130*a* toward the fourth side surface 1120*b* of the second housing 1120 in a direction perpendicular to the second folding axis B, and an eighth side surface 1130*c* extending from the other end of the sixth side surface 1130*a* toward the fifth side surface 1120*c* of the second housing 1120 in the direction perpendicular to the second folding axis B, wherein a first segmentation portion 215 is formed on the first side surface 210*a*, a second segmentation portion 225 is formed on the second side surface 210*b*, a third segmentation portion 1125 is formed on the fourth side surface 1120*b*, and a fourth segmentation portion 1135 is formed on the seventh side surface 1130*b*, wherein, in the case that the first housing 210, the second housing 1120, and the third housing 1130 are in a folded state, the second segmentation portion 225, the third segmentation portion 1125, and the fourth segmentation portion 1135 are disposed to overlap one another, and a portion of the first side surface 210*a* separated through the first segmentation portion 215 and a portion of the second side surface 210*b* separated through the second segmentation portion 225 are electrically connected to the processor 120 and operate as an antenna 240, wherein the antenna 240 includes a power supply unit 250*f* connected to a power supply point 250 disposed on the second side surface 210*b*, a first matching circuit S1 connected to a first point 251 located between the power supply point 250 and the first segmentation portion 215, and a second matching circuit S2 connected to a second point 252 located between the power supply point 250 and the second segmentation portion 225.

According to various embodiments, the second segmentation portion 225 and the third segmentation portion 1125 may be disposed on both sides of the first folding axis A of the hinge module 201.

According to various embodiments, the third segmentation portion 1125 and the fourth segmentation portion 1135 may be disposed on both sides of the second folding axis B of the folding part 1101.

According to various embodiments, the first matching circuit S1 may include a first switch and/or at least one lumped element, and the second matching circuit S2 may include a second switch and/or at least one lumped element.

According to various embodiments, a lumped element may include a capacitor or an inductor.

According to various embodiments, when the first matching circuit S1 is turned on and the second matching circuit S2 is operated in an open state under the control of the processor 120, the antenna 240 may be configured to operate the second area 242, which is a conductive portion between the first point 251 and the second segmentation portion 225, as a main radiation area.

According to various embodiments, when the second matching circuit S2 is turned on and the first matching circuit S1 operates in an open state under the control of the processor 120, the antenna 240 may be configured to operate the first area 241, which is a conductive portion between the first segmentation portion 215 and the second point 252, as a main radiation area.

According to various embodiments, the processor 120 may be configured for the antenna 2410 to operate in the low band frequency band of 600 MHz to 1200 MHz by adjusting the matching values of the first matching circuit S1 and/or the second matching circuit S2.

According to various embodiments, the multi-foldable electronic device 1100 may include a third matching circuit S3 connected to a third point 930 located on the first side surface 210*a* opposite to the first matching circuit S1 based on the first segmentation portion 215 and a fourth matching circuit S4 connected to a fourth point 940 located on the second side surface 210*b* in an opposite direction to the second matching circuit S2 based on the second segmentation portion 225.

According to various embodiments, the processor 120 may be configured for the antenna 240 to operate in a mid band frequency band of 1500 MHz to 2200 MHz and in a high band frequency band of 2300 MHz to 2700 MHz by adjusting the matching values of the third matching circuit S3 and/or the fourth matching circuit S4.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A foldable electronic device comprising:

a processor;

a hinge module;

an antenna electrically connected to the processor;

a first housing and a second housing, at least partially coupled to both sides of the hinge module, adapted to rotate about the hinge module to form an unfolded state or a folded state; and a flexible display disposed on the first housing and the second housing, wherein the first housing comprises a first lateral member forming at least a portion of an exterior of the foldable electronic device, the first lateral member comprises a first side surface disposed parallel to a folding axis of the hinge module, a second side surface extending in a direction perpendicular to the folding axis from one end of the first side surface, and a third side surface extending in the direction perpendicular to the folding axis from another end of the first side surface, wherein the second housing comprises a second lateral member forming at least a portion of the exterior of the foldable electronic device, the second lateral member comprises a fourth side surface disposed parallel to the folding axis, a fifth side surface extending in the direction perpendicular to the folding axis from one end of the fourth side surface, and a sixth side surface extending in the direction perpendicular to the folding axis from another end of the fourth side surface, wherein a first segmentation portion is formed on the first side surface, a second segmentation portion is formed on the second side surface, and a third segmentation portion is formed on the fifth side surface, wherein the antenna comprises:

an antenna radiator, extending along the first side surface and the second side surface and disposed between the first segmentation portion and the second segmentation portion;

a power supply unit;

a first matching circuit; and a second matching circuit, wherein the antenna radiator comprises a power supply point connected to the power supply unit, a first point connected to the first matching circuit and located between the power supply point and the first segmentation portion, and a second point connected to the second matching circuit and located between the power supply point and the second segmentation portion, and wherein the first point is electrically connected to a ground through the first matching circuit, and the second point is electrically connected to the ground through the second matching circuit.

2. The foldable electronic device of claim 1, further comprising:

a fourth segmentation portion formed on the fourth side surface, wherein, when the first housing and the second housing are in the folded state, the second segmentation portion and the third segmentation portion are disposed to overlap each other, and the first segmentation portion and the fourth segmentation portion are disposed to overlap each other.

3. The foldable electronic device of claim 1, wherein the first matching circuit is configured to comprise a first switch and/or at least one lumped element, and wherein the second matching circuit is configured to comprise a second switch and/or at least one lumped element.

4. The foldable electronic device of claim 3, wherein the at least one lumped element comprises a capacitor or an inductor.

5. The foldable electronic device of claim 3, wherein the processor is configured to control the first matching circuit or the second matching circuit to adjust a matching value.

6. The foldable electronic device of claim 5, wherein the processor is further configured to, when the first matching circuit is turned on and the second matching circuit is operated in an open state, control the antenna to operate a second area, which is a conductive portion between the first point and the second segmentation portion, as a main radiation area.

7. The foldable electronic device of claim 5, wherein the processor is further configured to, when the second matching circuit is turned on and the first matching circuit is operated in an open state, control the antenna to operate a first area, which is a conductive portion between the first segmentation portion and the second point, as a main radiation area.

8. The foldable electronic device of claim 5, wherein the processor is further configured to control the antenna to operate in a low band frequency band of 600 MHz to 1200 MHz by adjusting the matching value of the first matching circuit and/or the second matching circuit.

9. The foldable electronic device of claim 5, further comprising:

a third matching circuit connected to a third point located on the first side surface in an opposite direction to the first matching circuit based on the first segmentation portion; and a fourth matching circuit connected to a fourth point located on the second side surface in a direction opposite to the second matching circuit based on the second segmentation portion.

10. The foldable electronic device of claim 9, wherein the processor is further configured to control the antenna to operate in a mid band frequency band of 1500 MHz to 2200 MHz and or a high band frequency band of 2300 MHz to 2700 MHz by adjusting the matching value of the third matching circuit and/or the fourth matching circuit.

* * * * *